US008743029B2

(12) United States Patent
Tanikame et al.

(10) Patent No.: US 8,743,029 B2
(45) Date of Patent: Jun. 3, 2014

(54) DISPLAY DEVICE, DRIVING METHOD OF DISPLAY DEVICE, AND ELECTRONIC DEVICE

(75) Inventors: Takao Tanikame, Kanagawa (JP); Yukihito Iida, Kanagawa (JP); Tetsuo Minami, Tokyo (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 1333 days.

(21) Appl. No.: 12/153,404

(22) Filed: May 19, 2008

(65) Prior Publication Data

US 2009/0262102 A1   Oct. 22, 2009

(30) Foreign Application Priority Data

Jun. 15, 2007   (JP) .................................. 2007-158713

(51) Int. Cl.
*G09G 3/30* (2006.01)

(52) U.S. Cl.
USPC ............................................. 345/78; 345/76

(58) Field of Classification Search
USPC ......... 345/76–83, 204–215; 315/169.1–169.4
See application file for complete search history.

(56) References Cited

U.S. PATENT DOCUMENTS

| 7,768,485 | B2 * | 8/2010 | Uchino et al. ................... 345/76 |
| 2005/0057459 | A1 * | 3/2005 | Miyazawa ....................... 345/76 |
| 2005/0083270 | A1 * | 4/2005 | Miyazawa ....................... 345/76 |
| 2006/0176250 | A1 * | 8/2006 | Nathan et al. ................... 345/76 |
| 2007/0247398 | A1 * | 10/2007 | Nathan et al. ................... 345/82 |
| 2007/0268210 | A1 * | 11/2007 | Uchino et al. ................... 345/55 |
| 2012/0007842 | A1 | 1/2012 | Nathan et al. |

FOREIGN PATENT DOCUMENTS

| JP | 2003-271095 A | 9/2003 |
| JP | 2004-295131 A | 10/2004 |
| JP | 2006-133542 | 5/2006 |
| JP | 2008-523425 A | 7/2008 |
| JP | 2009-533717 A | 9/2009 |

OTHER PUBLICATIONS

Japanese Office Action issued Apr. 17, 2012 for corresponding Japanese Application No. 2007-158713.

* cited by examiner

*Primary Examiner* — Alexander Eisen
*Assistant Examiner* — Patrick F Marinelli
(74) *Attorney, Agent, or Firm* — Rader, Fishman & Grauer PLLC

(57) ABSTRACT

Disclosed herein is a display device including a pixel array unit, a first scanning circuit, a second scanning circuit and a selecting circuit.

19 Claims, 13 Drawing Sheets

BEFORE t=t1 t=t1 t=t2 t=t t=t4 t=t5 t=t6 t=t7

FIG.9A THRESHOLD VALUE CORRECTION: ABSENT, MOBILITY CORRECTION: ABSENT
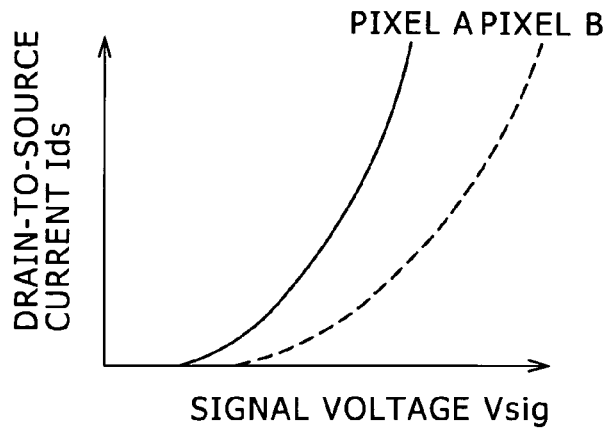
FIG.9B THRESHOLD VALUE CORRECTION: PRESENT, MOBILITY CORRECTION: ABSENT
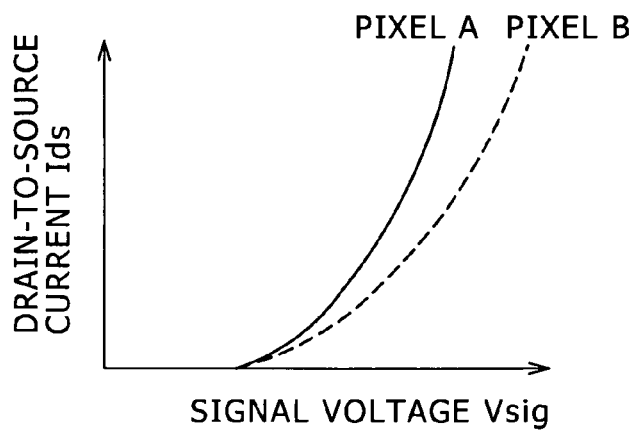
FIG.9C THRESHOLD VALUE CORRECTION: PRESENT, MOBILITY CORRECTION: PRESENT
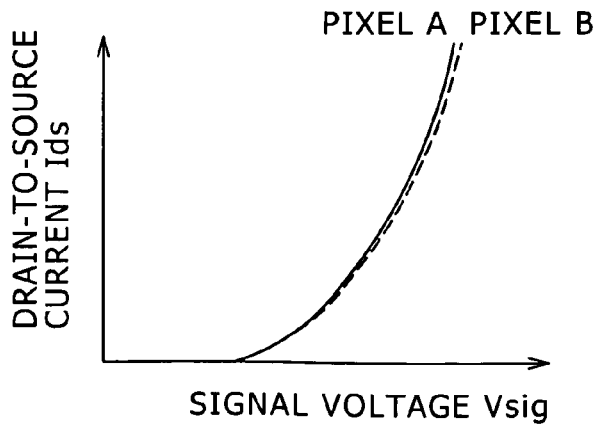

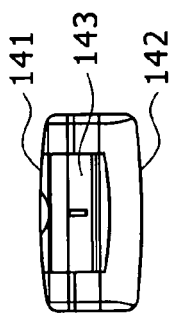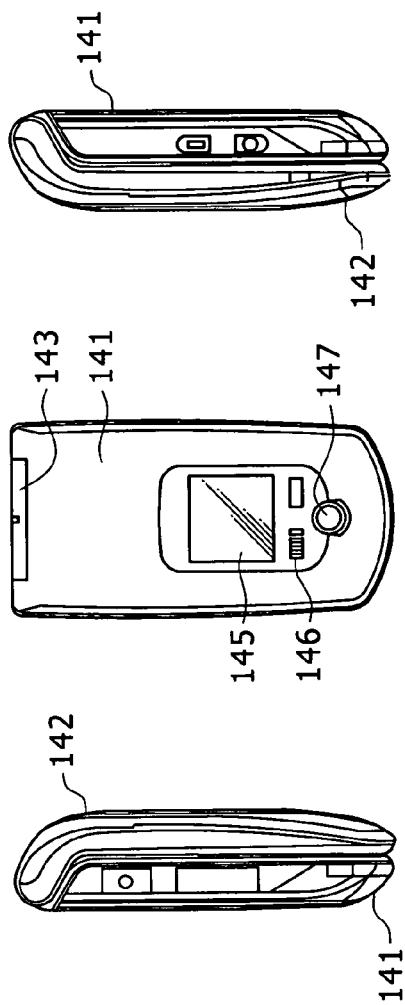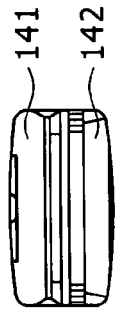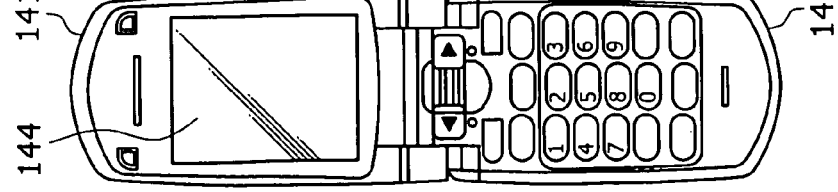

DISPLAY DEVICE, DRIVING METHOD OF DISPLAY DEVICE, AND ELECTRONIC DEVICE

CROSS REFERENCES TO RELATED APPLICATIONS

The present invention contains subject matter related to Japanese Patent Application JP 2007-158713 filed with the Japan Patent Office on Jun. 15, 2007, the entire contents of which being incorporated herein by reference.

BACKGROUND OF THE INVENTION

1. Field of the Invention

The present invention relates to a display device, a driving method of a display device, and an electronic device, and particularly to a flat type (flat panel type) display device formed by arranging pixels including an electrooptic element in the form of a matrix, a driving method of the display device, and an electronic device having the display device.

2. Description of the Related Art

In a field of display devices for making image display, flat type display devices formed by arranging pixels (pixel circuits) including a light emitting element in the form of a matrix have recently been spreading rapidly. The development and commercialization of a flat type display device using a so-called current-driven type electrooptic element changing in light emission luminance according to the value of current flowing through the device as the light emitting element of a pixel, for example an organic EL display device using an organic EL (Electro Luminescence) element utilizing a phenomenon of light being emitted when an electric field is applied to an organic thin film as the light emitting element of a pixel have been under way.

The organic EL display device has the following features. The organic EL element can be driven by an application voltage of 10 V or lower, and thus consumes low power. In addition, because the organic EL element is a self-luminous element, the organic EL display device provides high image visibility as compared with a liquid crystal display device that displays an image by controlling the intensity of light from a light source (backlight) in a liquid crystal cell in each pixel including the liquid crystal cell. Moreover, because an illuminating member such as the backlight or the like essential to the liquid crystal display device is not demanded, the organic EL display device can be easily reduced in weight and thickness. Further, because the organic EL element has a very high response speed of a few μsec or so, no afterimage occurs at a time of displaying a moving image.

As with the liquid crystal display device, the organic EL display device can adopt a simple (passive) matrix system and an active matrix system as driving system of the organic EL display device. However, while having a simple structure, a simple matrix type display device presents, for example, a problem of difficulty in realizing a large and high-definition display device because the emission period of an electrooptic element is reduced by an increase in the number of scanning lines (that is, the number of pixels).

Therefore an active matrix type display device that controls current flowing through an electrooptic element by an active element, for example, an insulated gate field effect transistor (typically a TFT (Thin Film Transistor)) provided within a same pixel circuit as the electrooptic element, has recently been actively developed. The active matrix type display device makes it easy to realize a large and high-definition display device because the electrooptic element continues emitting light over the period of one frame.

It is generally known that the I-V characteristic (current-voltage characteristic) of the organic EL element is degraded with the passage of time (so-called secular degradation). In a pixel circuit using an N-channel type TFT as a transistor that drives an organic EL element (which transistor will hereinafter be described as a "drive transistor"), the organic EL element is connected to the source side of the drive transistor. Thus, when the I-V characteristic of the organic EL element is degraded with the passage of time, the gate-to-source voltage Vgs of the drive transistor changes. As a result, the light emission luminance of the organic EL element also changes.

This will be described more specifically. The source potential of the drive transistor is determined by an operating point of the drive transistor and the organic EL element. When the I-V characteristic of the organic EL element is degraded, the operating point of the drive transistor and the organic EL element varies. Thus, even when a same voltage is applied to the gate of the drive transistor, the source potential of the drive transistor changes. Thereby, the gate-to-source voltage Vgs of the drive transistor changes, and therefore the value of current flowing through the drive transistor changes. As a result, the value of current flowing through the organic EL element also changes, so that the light emission luminance of the organic EL element changes.

Further, in a pixel circuit using a polysilicon TFT, in addition to a secular degradation in the I-V characteristic of an organic EL element, there occur secular changes in threshold voltage Vth of a drive transistor and in mobility μ of a semiconductor thin film forming the channel of the drive transistor (which mobility will hereinafter be described as "mobility of the drive transistor"), and there is a difference in the threshold voltage Vth and mobility μ in each pixel due to variations in a manufacturing process (there are variations between the characteristics of individual transistors).

When the threshold voltage Vth and the mobility μ of the drive transistor differ in each pixel, the value of current flowing through the drive transistor varies in each pixel. Thus, even when a same voltage is applied to the gates of respective drive transistors in different pixels, light emission luminance varies between respective organic EL elements in the different pixels. As a result, screen uniformity is impaired.

Accordingly, in order to hold the light emission luminance of the organic EL element constant even when a secular degradation occurs in the I-V characteristic of the organic EL element or a secular change occurs in the threshold voltage Vth or the mobility μ of the drive transistor, without being affected by the secular degradation in the I-V characteristic of the organic EL element or the secular change in the threshold voltage Vth or the mobility μ of the drive transistor, a constitution is adopted, which constitution provides each of pixel circuits with a function of compensating for variations in the characteristic of the organic EL element and correcting functions of correcting for variations in the threshold voltage Vth of the drive transistor (which correction will hereinafter be described as "threshold value correction") and correcting for variations in the mobility μ of the drive transistor (which correction will hereinafter be described as "mobility correction") (see Japanese Patent Laid-Open No. 2006-133542, for example).

By thus providing each pixel circuit with the function of compensating for variations in the characteristic of the organic EL element and the correcting functions of correcting for variations in the threshold voltage Vth and the mobility μ of the drive transistor, the light emission luminance of the organic EL element can be held constant even when a secular degradation occurs in the I-V characteristic of the organic EL element or a secular change occurs in the threshold voltage Vth or the mobility μ of the drive transistor, without being affected by the secular degradation in the I-V characteristic of the organic EL element or the secular change in the threshold voltage Vth or the mobility μ of the drive transistor.

SUMMARY OF THE INVENTION

At a time of operation for the threshold value correction, a process is performed in which the threshold voltage Vth is detected by making the source potential Vs of the drive transistor sufficiently rise after fixing the gate potential Vg and the source potential Vs of the drive transistor to predetermined potentials, respectively, and making the gate-to-source voltage Vgs of the drive transistor converge to the threshold voltage Vth of the drive transistor, and the threshold voltage Vth is retained in a retaining capacitance (details will be described later). To detect the threshold voltage Vth by making the gate-to-source voltage Vgs of the drive transistor converge to the threshold voltage Vth takes a certain time, for example, a time of about 1 H (H is a horizontal scanning period).

Recently, however, the period of 1 H (scanning time in a horizontal direction) tends to be shortened as the definition of the display device becomes higher. When the period of 1 H is shortened, it becomes difficult to allocate a sufficient time to detect the threshold voltage Vth as a threshold value correcting period. When a sufficient time may not be secured as a threshold value correcting period, a variation in the threshold voltage Vth of the drive transistor in each pixel may not be surely corrected (canceled).

As a result, a variation in the value of current flowing through the drive transistor in each pixel, which variation is caused by the variation in the threshold voltage Vth of the drive transistor in each pixel, may not be suppressed sufficiently. Therefore, as described above, even when a same voltage is applied to the gates of respective drive transistors in different pixels, light emission luminance varies between respective organic EL elements in the different pixels. Thereby, screen uniformity is impaired.

It is accordingly desirable to provide a display device, a driving method of the display device, and an electronic device using the display device that shortens a detection time taken to detect the threshold voltage of a drive transistor and which can thereby surely correct variations in the threshold value in each pixel even when the period of 1 H is shortened.

The present embodiment is characterized by adopting a constitution as follows in a display device including: a pixel array unit formed by arranging pixels in a form of a matrix, the pixels including an electrooptic element, a writing transistor for writing a video signal, a retaining capacitance for retaining the video signal written by the writing transistor, and a drive transistor for driving the electrooptic element on a basis of the video signal retained in the retaining capacitance; a first scanning circuit for selectively supplying a first potential and a second potential lower than the first potential to a power supply line that is disposed in each pixel row of the pixel array unit and which supplies current to the drive transistor; a second scanning circuit for selecting the pixels of the pixel array unit in row units by driving the writing transistor in each pixel row of the pixel array unit; and a selecting circuit for selectively supplying the video signal, a first offset voltage serving as a reference for the video signal, and a second offset voltage different from the first offset voltage to a signal line disposed in each column of the pixel array unit.

The second offset voltage is selected and the writing transistor is set in a conducting state in a period in which the second potential is selected. Next, a change is made from the second potential to the first potential. Next, the first offset voltage is selected in place of the second offset voltage. Thereafter the writing transistor is set in a non-conducting state.

In the display device of the above-described constitution and an electronic device having the display device, the first scanning circuit selects the second potential, whereby the source potential of the drive transistor becomes the second potential. In the period in which the second potential is selected, the selecting circuit selects the second offset voltage, and the second scanning circuit sets the writing transistor in a conducting state. The second offset voltage from the signal line is thereby written by the writing transistor, so that the gate potential of the drive transistor becomes the second offset voltage. The source potential and the gate potential of the drive transistor are thus initialized.

Initializing the gate potential of the drive transistor to the second offset voltage makes the gate-to-source voltage of the drive transistor higher than in a case of initializing the gate potential to the first offset voltage serving as a reference for the video signal. Because a current corresponding to the gate-to-source voltage flows through the drive transistor, the source potential of the drive transistor rises at a fast response speed. Thereafter the first scanning circuit changes from the second potential to the first potential, whereby a detection period for detecting the threshold voltage of the drive transistor is started.

After the detection period begins, the selecting circuit selects the first offset voltage in place of the second offset voltage. At this time, the writing transistor is in a conducting state; therefore, the first offset voltage is written from the signal line, so that the gate potential of the drive transistor becomes the first offset voltage. The gate-to-source voltage of the drive transistor eventually converges to the threshold voltage of the drive transistor. Then, the second scanning circuit sets the writing transistor in a non-conducting state, whereby the gate-to-source voltage of the drive transistor which voltage has converged to the threshold voltage of the drive transistor is retained by the retaining capacitance, and the threshold voltage detection period ends.

According to the present embodiment, the source potential of the drive transistor is made to rise at a fast response speed by initializing the gate potential of the drive transistor to the second offset voltage different from the first offset voltage serving as a reference for the video signal. Therefore a detection time taken to detect the threshold voltage of the drive transistor can be shortened. It is thus possible surely to correct variations in the threshold voltage in each pixel even when the period of 1 H becomes shorter, and thereby provide a display image of excellent image quality.

BRIEF DESCRIPTION OF THE DRAWINGS

FIGS. 9A, 9B, and 9C are characteristic diagrams for assistance in explaining relations between the signal voltage Vsig of a video signal and the drain-to-source current Ids of the drive transistor according to whether or not threshold value correction and mobility correction are made;

FIGS. 16A, 16B, 16C, 16D, 16E, 16F, and 16G are diagrams showing an external appearance of a portable telephone to which the present embodiment is applied, FIG. 16A being a front view of the portable telephone in an opened state, FIG. 16B being a side view of the portable telephone in the opened state, FIG. 16C being a front view of the portable telephone in a closed state, FIG. 16D being a left side view, FIG. 16E being a right side view, FIG. 16F being a top view, and FIG. 16G being a bottom view.

DETAILED DESCRIPTION OF THE PREFERRED EMBODIMENTS

Preferred embodiments of the present invention will hereinafter be described in detail with reference to the drawings.

Figure 1:
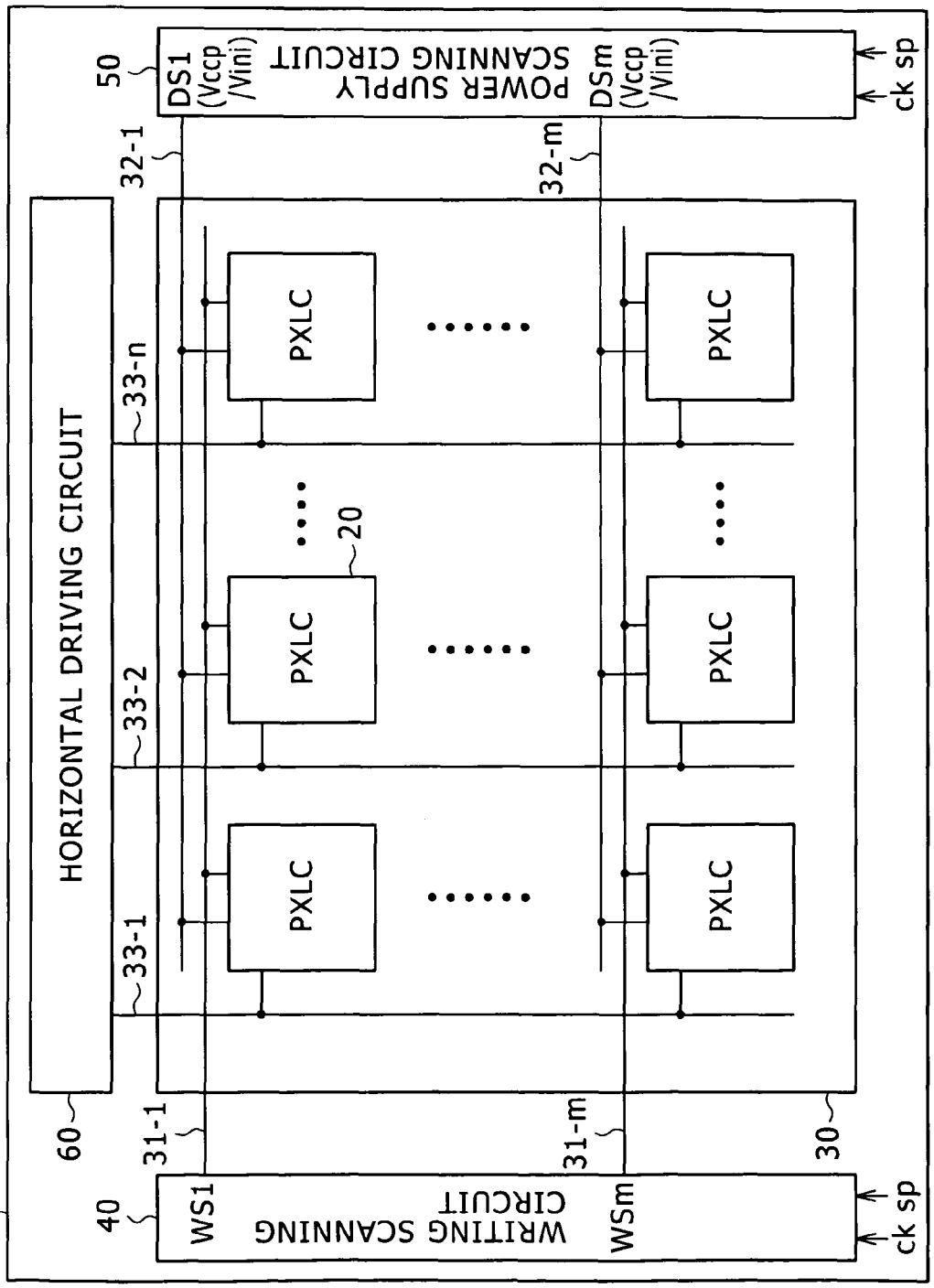
FIG. 1 is a system configuration diagram schematically showing a configuration of an organic EL display device according to an embodiment of the present invention.

FIG. 1 is a system configuration diagram schematically showing a configuration of an active matrix type display device according to an embodiment of the present invention.

Description in the following will be made by taking as an example a case of an active matrix type organic EL display device using a current-driven type electrooptic element changing in light emission luminance according to the value of current flowing through the device, for example, an organic EL element as a light emitting element of a pixel (pixel circuit).

As shown in FIG. 1, the organic EL display device 10 according to the present embodiment includes a pixel array unit 30 formed by two-dimensionally arranging pixels (PXLC) 20 in the form of a matrix and a driving unit for driving each of the pixels 20, the driving unit being disposed around the periphery of the pixel array unit 30. The driving unit for driving the pixels 20 includes for example a writing scanning circuit 40, a power supply scanning circuit 50, and a horizontal driving circuit 60.

The pixel array unit 30 has scanning lines 31-1 to 31-m and power supply lines 32-1 to 32-m arranged for each pixel row of a pixel arrangement of m rows and n columns, and has signal lines 33-1 to 33-n arranged for each pixel column of the pixel arrangement of the m rows and the n columns.

Generally, the pixel array unit 30 is formed on a transparent insulating substrate such as a glass substrate or the like, and has a flat panel structure. Each of the pixels 20 of the pixel array unit 30 can be formed using an amorphous silicon TFT (Thin Film Transistor) or a low-temperature polysilicon TFT. When a low-temperature polysilicon TFT is used, the writing scanning circuit 40, the power supply scanning circuit 50, and the horizontal driving circuit 60 can also be mounted on a display panel (substrate) 70 on which the pixel array unit 30 is formed.

The writing scanning circuit 40 is formed by a shift register or the like that shifts (transfers) a start pulse sp in synchronism with a clock pulse ck. When a video signal is written to each of the pixels 20 of the pixel array unit 30, the writing scanning circuit 40 sequentially supplies scanning signals WS1 to WSm to the scanning lines 31-1 to 31-m, and thereby scans the pixels 20 in order in row units (line-sequential scanning).

The power supply scanning circuit 50 is formed by a shift register or the like that shifts the start pulse sp in synchronism with the clock pulse ck. In synchronism with the line-sequential scanning of the writing scanning circuit 40, the power supply scanning circuit 50 supplies power supply line potentials DS1 to DSm changing between a first potential Vccp and a second potential Vini lower than the first potential Vccp to the power supply lines 32-1 to 32-m, and thereby controls the conduction (on)/non-conduction (off) of a drive transistor 22 to be described later (see FIG. 2).

The horizontal driving circuit 60 selects, as appropriate, one of the signal voltage Vsig of the video signal corresponding to luminance information supplied from a signal supply source (not shown) (the signal voltage Vsig may hereinafter be described simply as "signal voltage"), a first offset voltage Vofs, and a second offset voltage Vofs2, and then writes the voltage to the pixels 20 of the pixel array unit 30 in row units, for example, via the signal lines 33-1 to 33-n. That is, the horizontal driving circuit 60 employs the driving form of line-sequential writing in which the signal voltage Vsig of the video signal is written in row (line) units.

In this case, the first offset voltage Vofs is a reference voltage (corresponding to a black level, for example) serving as a reference for the signal voltage Vsig of the video signal, and the second offset voltage Vofs2 is a voltage higher by a predetermined voltage than the first offset voltage Vofs. The second potential Vini is set as a potential lower than the first offset voltage Vofs. For example, letting Vth be the threshold voltage of the drive transistor 22, the second potential Vini is set as a potential lower than Vofs−Vth, or preferably set as a potential sufficiently lower than Vofs−Vth.

(Pixel Circuit)

Figure 2:
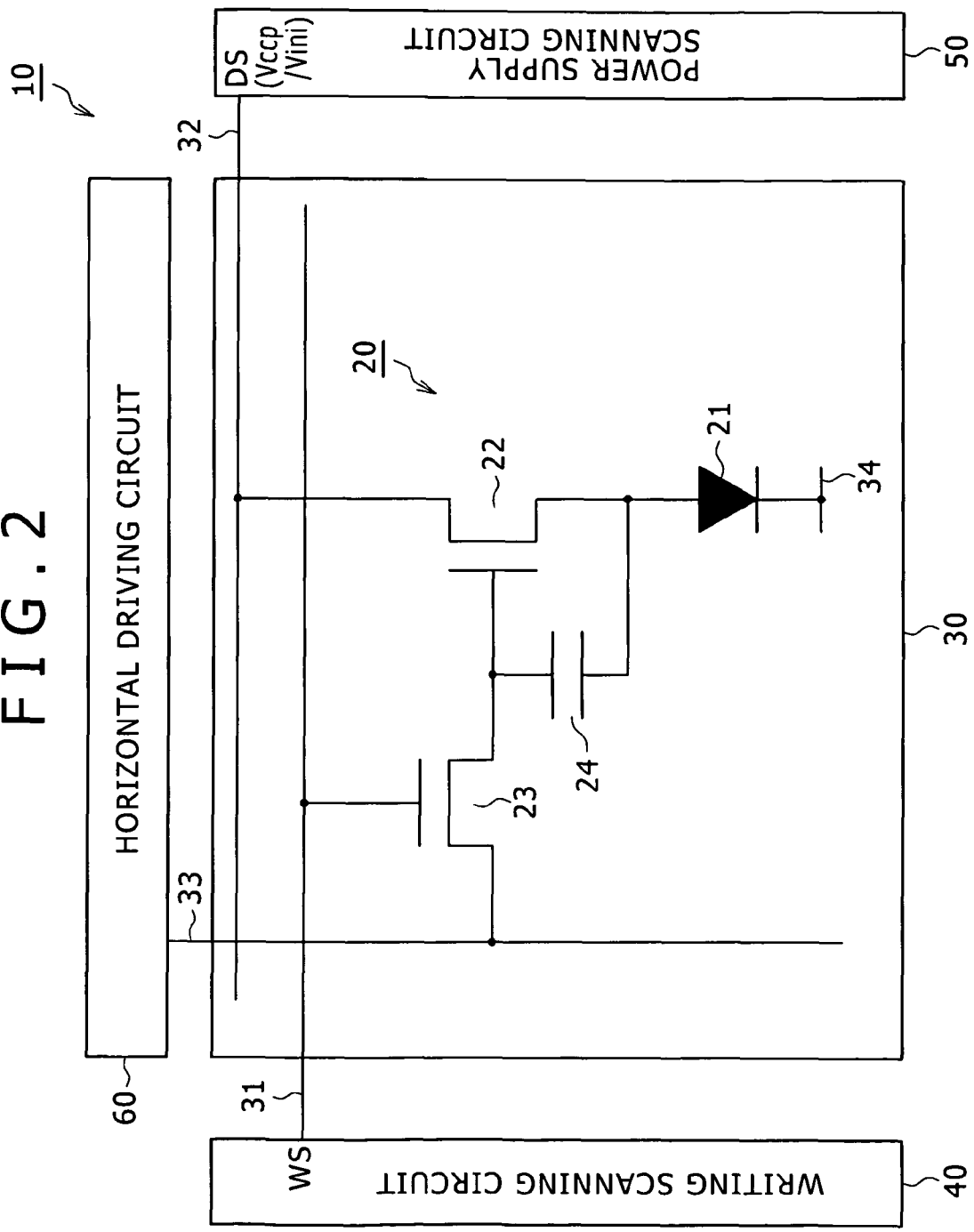
FIG. 2 is a circuit diagram showing a concrete example of configuration of a pixel (pixel circuit)

FIG. 2 is a circuit diagram showing a concrete example of configuration of a pixel (pixel circuit) 20.

As shown in FIG. 2, the pixel 20 has a current-driven type electrooptic element changing in light emission luminance according to the value of current flowing through the device, for example, an organic EL element 21 as a light emitting element. The pixel 20 is of a pixel configuration having a drive transistor 22, a writing transistor 23, and a retaining capacitance 24 in addition to the organic EL element 21, that is, a 2Tr/1C pixel configuration composed of two transistors (Tr) and one capacitance element (C).

In the pixel 20 of such a configuration, an N-channel type TFT is used as the drive transistor 22 and the writing transistor 23. However, a combination of the conduction types of the drive transistor 22 and the writing transistor 23 in this case is a mere example, and the drive transistor 22 and the writing transistor 23 are not limited to the combination of these conduction types.

The organic EL element 21 has a cathode electrode connected to a common power supply line 34 arranged so as to be common to all the pixels 20. The drive transistor 22 has a source electrode connected to the anode electrode of the organic EL element 21, and has a drain electrode connected to a power supply line 32 (power supply lines 32-1 to 32-$m$).

The writing transistor 23 has a gate electrode connected to a scanning line 31 (scanning lines 31-1 to 31-$m$), has one electrode (source electrode/drain electrode) connected to a signal line 33 (signal lines 33-1 to 33-$n$), and has another electrode (drain electrode/source electrode) connected to the gate electrode of the drive transistor 22.

The retaining capacitance 24 has one terminal connected to the gate electrode of the drive transistor 22, and has another terminal connected to the source electrode of the drive transistor 22 (the anode electrode of the organic EL element 21). Incidentally, an auxiliary capacitance can be connected in parallel with the organic EL element 21 to compensate for an insufficiency of capacitance of the organic EL element 21.

In the pixel 20 of the 2Tr/1C pixel configuration, the writing transistor 23 changes to a conducting state in response to a scanning signal WS applied to the gate electrode from the writing scanning circuit 40 via the scanning line 31. The writing transistor 23, thereby, samples the signal voltage Vsig of the video signal corresponding to luminance information, the first offset voltage Vofs1, or the second offset voltage Vofs2, which voltage is supplied from the horizontal driving circuit through the signal line 33, and then writes the voltage to the inside of the pixel 20.

The written voltage, that is, the signal voltage Vsig, the offset voltage Vofs1, or the offset voltage Vofs2 is applied to the gate electrode of the drive transistor 22, and is retained in the retaining capacitance 24. When the potential DS of the power supply line 32 (power supply lines 32-1 to 32-$m$) is the first potential Vccp, the drive transistor 22 is supplied with current from the power supply line 32, and supplies the organic EL element 21 with a driving current having a current value corresponding to the voltage value of the signal voltage Vsig retained in the retaining capacitance 24. The drive transistor 22 thus drives the organic EL element 21 by the current to make the organic EL element 21 emit light.

(Pixel Structure)

Figure 3:
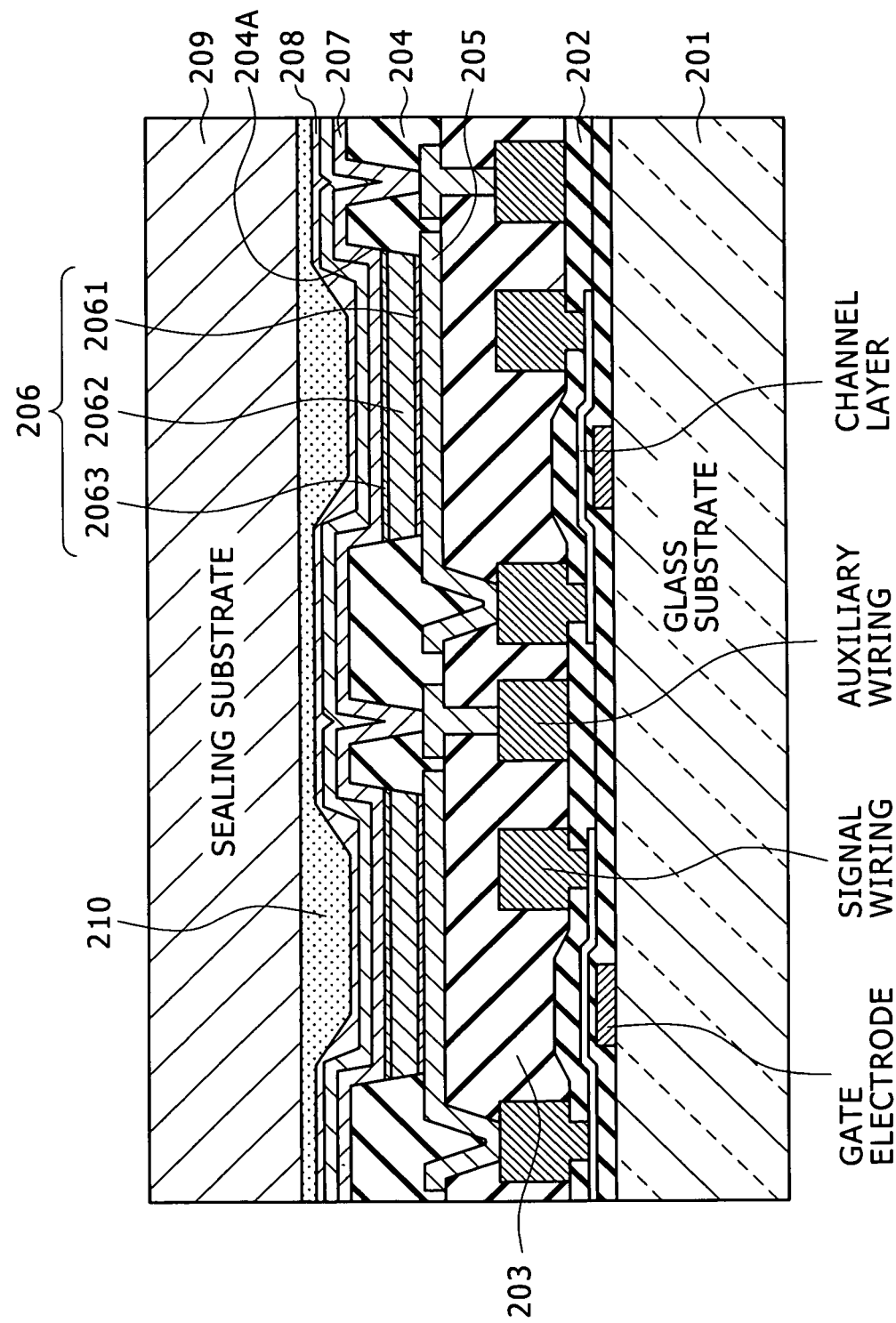
FIG. 3 is a sectional view of an example of sectional structure of the pixel.

FIG. 3 is a sectional view of an example of sectional structure of the pixel 20. As shown in FIG. 3, the pixel 20 has a structure having an insulating film 202, an insulating planarizing film 203, and a window insulating film 204 formed in order on a glass substrate 201 on which the pixel circuit of the drive transistor 22, the writing transistor 23 and the like is formed, and having the organic EL element 21 in a concave part 204A of the window insulating film 204.

The organic EL element 21 includes: an anode electrode 205 made of a metal or the like formed in a bottom part of the concave part 204A of the window insulating film 204; an organic layer (an electron transporting layer, a light emitting layer, and a hole transporting layer/hole injection layer) 206 formed on the anode electrode 205; and a cathode electrode 207 made of a transparent conductive film or the like and formed on the organic layer 206 in such a manner as to be common to all the pixels.

The organic layer 206 in the organic EL element 21 is formed by sequentially depositing a hole transporting layer/hole injection layer 2061, a light emitting layer 2062, an electron transporting layer 2063, and an electron injection layer (not shown) on the anode electrode 205. Under the current driving of the drive transistor 22 in FIG. 2, a current flows from the drive transistor 22 through the anode electrode 205 to the organic layer 206. Thereby light is emitted when electrons and holes recombine with each other in the light emitting layer 2062 within the organic layer 206.

As shown in FIG. 3, after the organic EL element 21 is formed in a pixel unit on the glass substrate 201 on which the pixel circuit is formed, with the insulating film 202, the insulating planarizing film 203, and the window insulating film 204 interposed between the organic EL element 21 and the glass substrate 201, a sealing substrate 209 is joined by an adhesive 210 with a passivation film 208 interposed between the organic EL element 21 and the sealing substrate 209, and the sealing substrate 209 seals the organic EL element 21. Thereby the display panel 70 is formed.

(Basic Circuit Operation of Organic EL Display Device)

In order to facilitate understanding, a basic circuit operation in a case where reference voltage Vofs selectively written to the pixel 20 is fixed at the first offset voltage Vofs1 (Vofs=Vofs1) in the organic EL display device 10 according to the present embodiment will be described below with reference to operation explanatory diagrams of FIGS. 5A to 6D on the basis of a timing waveform chart of FIG. 4.

Incidentally, in the operation explanatory diagrams of FIGS. 5A to 6D, the writing transistor 23 is represented by the symbol of a switch in order to simplify the drawings. In addition, because the organic EL element 21 has a parasitic capacitance Cel, the parasitic capacitance Cel is also shown in the diagrams.

Figure 4:
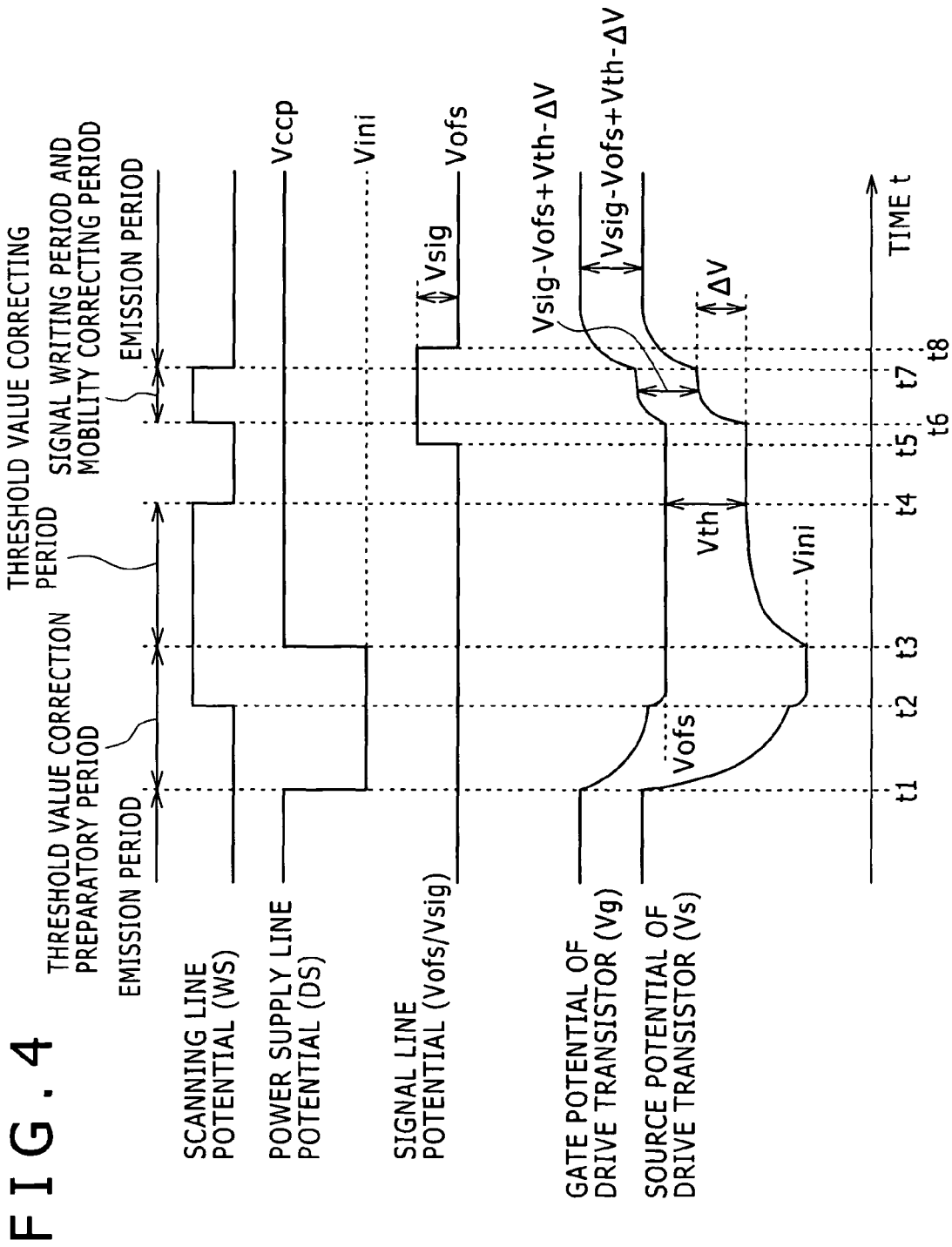
FIG. 4 is a timing waveform chart for assistance in explaining a basic circuit operation of an organic EL display device according to an embodiment of the present invention.

The timing waveform chart of FIG. 4 shows changes in potential (scanning signal) WS of the scanning line 31 to 31-$m$), changes in potential DS of the power supply line 32 (32-1 to 32-$m$), and changes in gate potential Vg and source potential Vs of the drive transistor 22 in one H (H is a horizontal scanning period) along a common time axis.

<Emission Period>

The organic EL element 21 is in a light emitting state before time t1 in the timing chart of FIG. 4 (emission period). During this emission period, the potential DS of the power supply line 32 is the first potential Vccp, and the writing transistor 23 is in a non-conducting state.

Figure 5A:
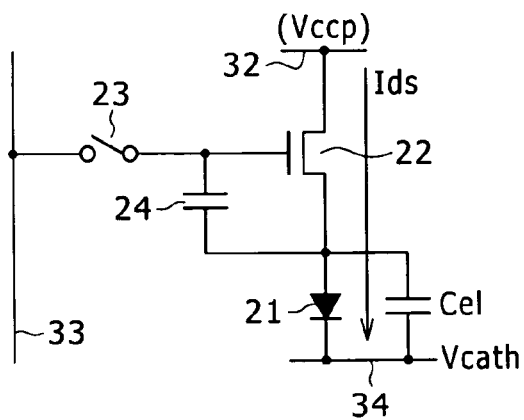
FIGS. 5A, 5B, 5C, and 5D are diagrams (1) for assistance in explaining the basic circuit operation.

At this time, because the drive transistor 22 is set to operate in a saturation region, as shown in FIG. 5A, a driving current (drain-to-source current) Ids corresponding to the gate-to-source voltage Vgs of the drive transistor 22 is supplied from the power supply line 32 through the drive transistor 22 to the organic EL element 21. The organic EL element 21 thus emits light at a luminance corresponding to the current value of the driving current Ids.

<Threshold Value Correction Preparatory Period>

Figure 5B:
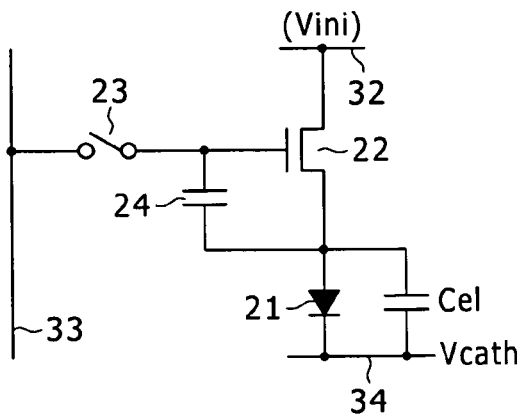

A new field of line-sequential scanning begins at time t1. As shown in FIG. 5B, the potential DS of the power supply line 32 changes from the first potential (hereinafter described as "high potential") Vccp to the second potential (hereinafter described as "low potential") Vini sufficiently lower than the offset voltage Vofs−Vth of the signal line 33.

Letting Vel be the threshold voltage of the organic EL element 21 and Vcath be the potential of the common power supply line 34, when the low potential Vini is Vini<Vel+

Vcath, the source potential Vs of the drive transistor 22 becomes substantially equal to the low potential Vini, and thus the organic EL element 21 is set in a reverse-biased state and quenched.

Figure 5C:
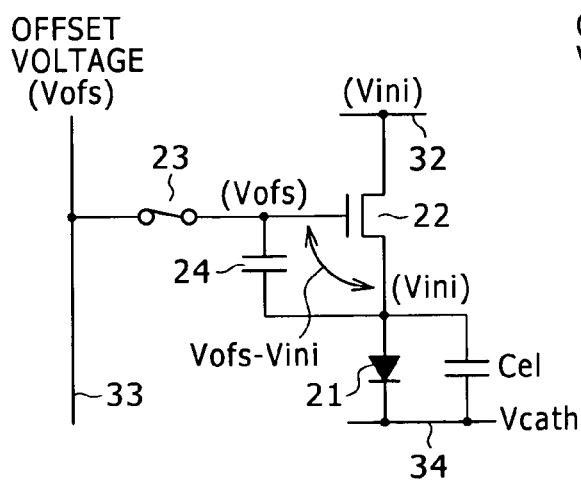

At next time t2, the potential WS of the scanning line 31 makes a transition from a low potential side to a high potential side. Thus, as shown in FIG. 5C, the writing transistor 23 is set in a conducting state. At this time, because an offset voltage Vofs is supplied from the horizontal driving circuit 60 to the signal line 33, the gate potential Vg of the drive transistor 22 becomes the offset voltage Vofs. The source potential Vs of the drive transistor 22 is the potential Vini, which is sufficiently lower than the offset voltage Vofs.

At this time, the gate-to-source voltage Vgs of the drive transistor 22 is Vofs−Vini. If Vofs−Vini is not higher than the threshold voltage Vth of the drive transistor 22, threshold value correcting operation to be described later may not be performed. A potential relation therefore needs to be set such that Vofs−Vini>Vth. Thus, the operation of fixing (determining) and initializing the gate potential Vg of the drive transistor 22 and the source potential Vs of the drive transistor 22 to the offset voltage Vofs and the low potential Vini, respectively, is threshold value correction preparatory operation.

<Threshold Value Correcting Period>

Figure 5D:
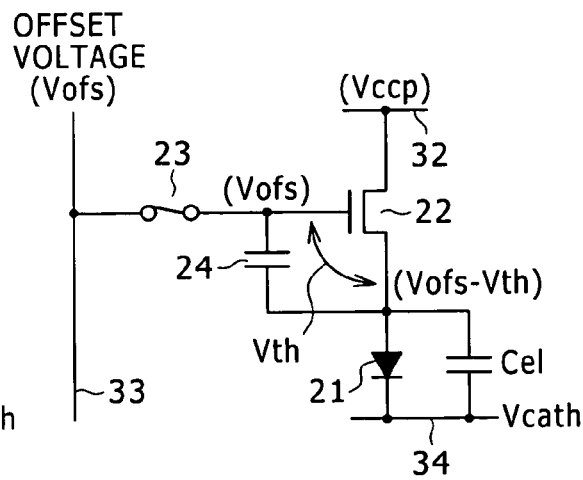

As shown in FIG. 5D, when the potential DS of the power supply line 32 changes from the low potential Vini to the high potential Vccp at next time t3, the source potential Vs of the drive transistor 22 starts to rise. Eventually, the gate-to-source voltage Vgs of the drive transistor 22 converges to the threshold voltage Vth of the drive transistor 22, and voltage corresponding to the threshold voltage Vth is retained in the retaining capacitance 24.

For convenience, the period of detecting the threshold voltage Vth and retaining the voltage corresponding to the threshold voltage Vth in the retaining capacitance 24 is referred to as a threshold value correcting period. Incidentally, in the threshold value correcting period, in order for current to flow only to the side of the retaining capacitance 24 and not to flow to the side of the organic EL element 21, the potential Vcath of the common power supply line 34 is set such that the organic EL element 21 is in a cutoff state.

Figure 6A:
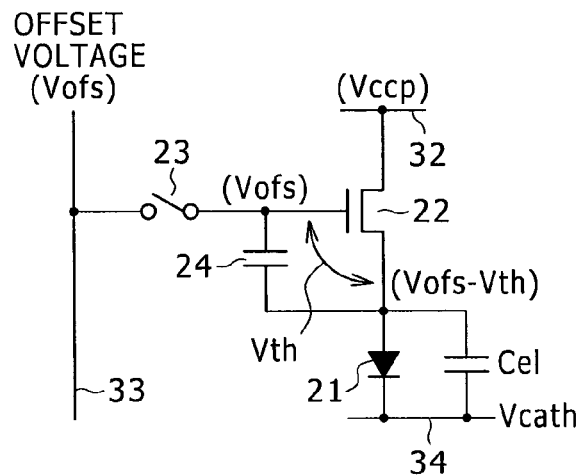
FIGS. 6A, 6B, 6C, and 6D are diagrams (2) for assistance in explaining the basic circuit operation.

At next time t4, the potential WS of the scanning line 31 makes a transition to the low potential side. Thus, as shown in FIG. 6A, the writing transistor 23 is set in a non-conducting state. At this time, the gate electrode of the drive transistor 22 is in a floating state. However, because the gate-to-source voltage Vgs is equal to the threshold voltage Vth of the drive transistor 22, the drive transistor 22 is in a cutoff state. Therefore drain-to-source current Ids does not flow through the drive transistor 22.

<Writing Period/Mobility Correcting Period>

Figure 6B:
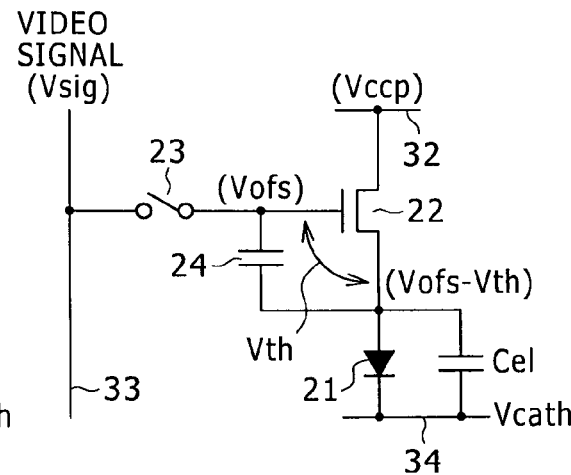
Figure 6C:
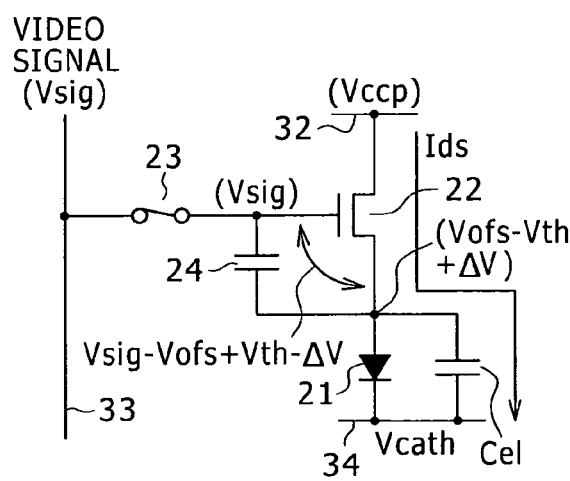

At next time t5, as shown in FIG. 6B, the potential of the signal line 33 changes from the offset voltage Vofs to the signal voltage Vsig of a video signal. Then, the potential WS of the scanning line 31 makes a transition to the high potential side. Thereby, as shown in FIG. 6C, the writing transistor 23 is set in a conducting state, samples the signal voltage Vsig of the video signal, and writes the signal voltage Vsig to the inside of the pixel 20.

As a result of writing the signal voltage Vsig by the writing transistor 23, the gate potential Vg of the drive transistor 22 becomes the signal voltage Vsig. When the drive transistor 22 is driven by the signal voltage Vsig of the video signal, the threshold voltage Vth of the drive transistor 22 is canceled out by the voltage corresponding to the threshold voltage Vth, the voltage corresponding to the threshold voltage Vth being retained in the retaining capacitance 24, whereby threshold value correction is made. Principles of the threshold value correction will be described later.

At this time, because the organic EL element 21 is first in a cutoff state (high-impedance state), a current (drain-to-source current Ids) flowing from the power supply line 32 through the drive transistor 22 according to the signal voltage Vsig of the video signal flows into the parasitic capacitance Cel of the organic EL element 21, and thus the charging of the parasitic capacitance Cel is started.

By charging the parasitic capacitance Cel, the source potential Vs of the drive transistor 22 rises with the passage of time. At this time, a variation in the threshold voltage Vth of the drive transistor 22 is already corrected, and the drain-to-source current Ids of the drive transistor 22 is dependent on the mobility μ of the drive transistor 22.

When the source potential Vs of the drive transistor 22 eventually rises to a potential Vofs−Vth+ΔV, the gate-to-source voltage Vgs of the drive transistor 22 becomes Vsig−Vofs+Vth−ΔV. That is, the rise ΔV in source potential Vs acts to be subtracted from the voltage retained in the retaining capacitance 24 (Vsig−Vofs+Vth), or to discharge a charge of the retaining capacitance 24, so that negative feedback is applied. Therefore the rise ΔV in source potential Vs is the feedback amount of the negative feedback.

By thus negatively feeding back the drain-to-source current Ids flowing through the drive transistor 22 to the gate input of the drive transistor 22, that is, the gate-to-source voltage Vgs, mobility correction is made which mobility correction cancels out the dependence of the drain-to-source current Ids of the drive transistor 22 on the mobility μ of the drive transistor 22, that is, corrects a variation in mobility μ in each pixel.

More specifically, as the signal voltage Vsig of the video signal becomes higher, the drain-to-source current Ids is increased, and thus the absolute value of the feedback amount (amount of correction) ΔV of the negative feedback is increased. Therefore the mobility correction is made according to the level of light emission luminance. In addition, when the signal voltage Vsig of the video signal is made constant, the absolute value of the feedback amount ΔV of the negative feedback is increased as the mobility μ of the drive transistor 22 becomes higher. Variations in mobility μ in each pixel can therefore be removed. Principles of the mobility correction will be described later.

<Emission Period>

Figure 6D:
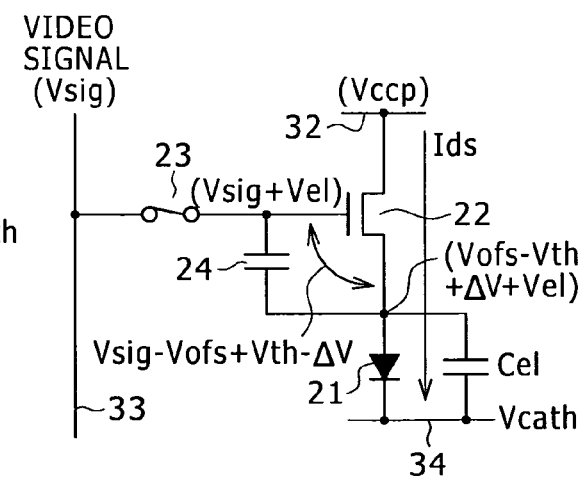

At next time t7, the potential WS of the scanning line 31 makes a transition to the low potential side. Thus, as shown in FIG. 6D, the writing transistor 23 is set in a non-conducting state. The gate electrode of the drive transistor 22 is disconnected from the signal line 33, and is thus set in a floating state.

When the gate electrode of the drive transistor 22 is in a floating state, and the source potential Vs of the drive transistor 22 changes, the gate potential Vg of the drive transistor 22 also changes in such a manner as to be interlocked with (follow) the change in the source potential Vs, because the retaining capacitance 24 is connected between the gate and the source of the drive transistor 22. This is bootstrap operation by the retaining capacitance 24.

The gate electrode of the drive transistor 22 is set in a floating state, and at the same time, the drain-to-source current Ids of the drive transistor 22 starts to flow through the organic EL element 21. The anode potential of the organic EL element 21 thereby rises according to the drain-to-source current Ids of the drive transistor 22.

The rise in the anode potential of the organic EL element 21 is none other than a rise in the source potential Vs of the drive transistor 22. When the source potential Vs of the drive transistor 22 rises, the gate potential Vg of the drive transistor 22 also rises in such a manner as to be interlocked with the source potential Vs of the drive transistor 22 due to the bootstrap operation of the retaining capacitance 24.

At this time, assuming that a bootstrap gain is one (ideal value), the amount of the rise in the gate potential Vg is equal to the amount of the rise in the source potential Vs. Thus the gate-to-source voltage Vgs of the drive transistor 22 is held constant at Vsig−Vofs+Vth−ΔV during the emission period. Then, at time t8, the potential of the signal line 33 changes from the signal voltage Vsig of the video signal to the offset voltage Vofs.

(Principles of Threshold Value Correction)

Principles of correction for the threshold value of the drive transistor 22 will be described in the following. The drive transistor 22 operates as a constant-current source because the drive transistor 22 is designed to operate in a saturation region. Thus, the constant drain-to-source current (driving current) Ids given by the following Equation (1) is supplied from the drive transistor 22 to the organic EL element 21.

$$Ids=(1/2)\times\mu(W/L)Cox(Vgs-Vth)^2 \quad (1)$$

where W is the channel width of the drive transistor 22, L is the channel length thereof, and Cox is a gate capacitance per unit area.

Figure 7:
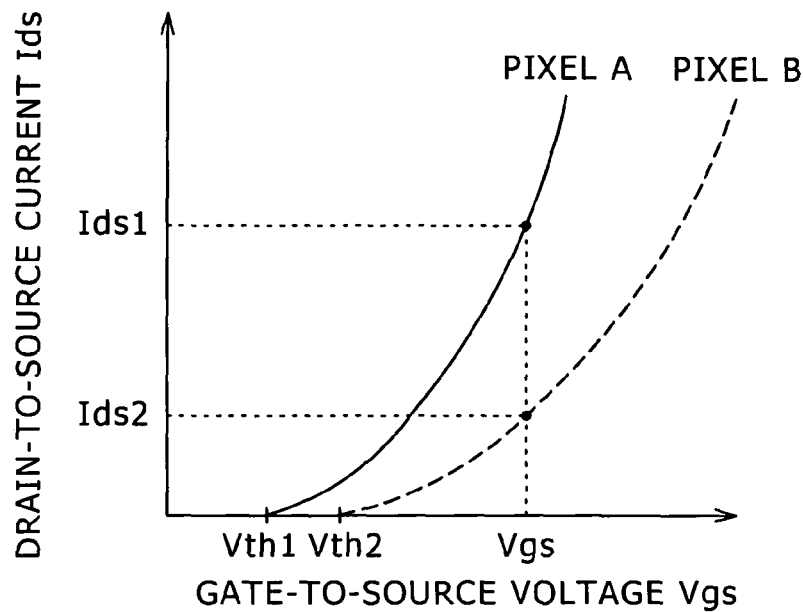
FIG. 7 is a characteristic diagram for assistance in explaining a problem caused by variations in threshold voltage Vth of drive transistors.

FIG. 7 shows a characteristic of the drain-to-source current Ids versus the gate-to-source voltage Vgs of the drive transistor 22.

As shown in the characteristic diagram, in a case where a variation in the threshold voltage Vth of the drive transistor 22 in each pixel is not corrected, when the threshold voltage Vth is Vth1, the drain-to-source current Ids corresponding to the gate-to-source voltage Vgs is Ids1.

On the other hand, when the threshold voltage Vth is Vth2 (Vth2>Vth1), the drain-to-source current Ids corresponding to the same gate-to-source voltage Vgs is (Ids2<Ids1). That is, when the threshold voltage Vth of the drive transistor 22 varies, the drain-to-source current Ids varies even though the gate-to-source voltage Vgs is constant.

On the other hand, in the pixel (pixel circuit) 20 of the above-described configuration, the gate-to-source voltage Vgs of the drive transistor 22 during light emission is Vsig−Vofs+Vth−ΔV, as described above, and thus when Vsig−Vofs+Vth−ΔV is substituted in Equation (1), the drain-to-source current Ids is expressed as $$Ids=(1/2)\times\mu(W/L)Cox(Vsig-Vofs-\Delta V)^2 \quad (2)$$

That is, the term of the threshold voltage Vth of the drive transistor 22 is cancelled, and the drain-to-source current Ids supplied from the drive transistor 22 to the organic EL element 21 is not dependent on the threshold voltage Vth of the drive transistor 22. As a result, even when the threshold voltage Vth of the drive transistor 22 varies in each pixel due to variations in a process of manufacturing the drive transistor 22 and secular changes of the drive transistor 22, the drain-to-source current Ids does not vary. The light emission luminance of the organic EL element 21 can therefore be held constant.

(Principles of Mobility Correction)

Figure 8:
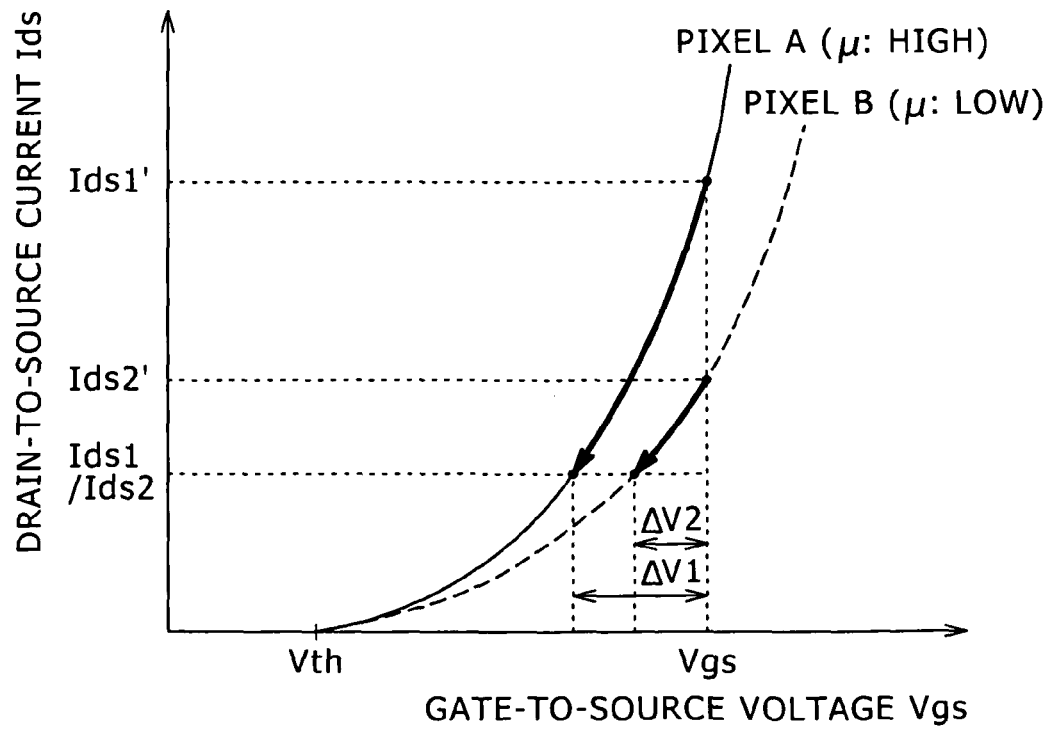
FIG. 8 is a characteristic diagram for assistance in explaining a problem caused by variations in mobility μ of drive transistors.

Principles of correction for the mobility of the drive transistor 22 will next be described. FIG. 8 shows characteristic curves in a state in which a pixel A including a drive transistor 22 having relatively high mobility μ and a pixel B including a drive transistor 22 having relatively low mobility μ are compared with each other. When the drive transistor 22 is formed by a polysilicon thin film transistor or the like, mobility μ inevitably varies between pixels such as the pixel A and the pixel B.

In a state of mobility μ varying between the pixel A and the pixel B, when the signal voltages Vsig of the video signal at a same level are written to both the pixels A and B, and when no correction is made for mobility μ, there occurs a great difference between a drain-to-source current Ids1' flowing in the pixel A having the high mobility μ and a drain-to-source current Ids2' flowing in the pixel B having the low mobility μ. When a great difference thus occurs in drain-to-source current Ids between pixels due to variations in mobility μ in each pixel, screen uniformity is impaired.

As is clear from the above-described Equation (1) as a transistor characteristic equation, the higher the mobility μ, the larger the drain-to-source current Ids. Hence, the higher the mobility μ, the larger the feedback amount ΔV in negative feedback. As shown in FIG. 8, the feedback amount ΔV1 of the pixel A having the high mobility μ is larger than the feedback amount ΔV2 of the pixel B having the low mobility μ.

Accordingly, mobility correcting operation negatively feeds back the drain-to-source current Ids of the drive transistor 22 to the side of the signal voltage Vsig of the video signal. Thereby the negative feedback being applied is increased as mobility μ becomes higher. Thus, variations in mobility μ in each pixel can be suppressed.

Specifically, when the correction of the feedback amount ΔV1 is applied in the pixel A having the high mobility μ, the drain-to-source current Ids falls greatly from Ids1' to Ids1. On the other hand, because the feedback amount ΔV2 of the pixel B having the low mobility μ is small, the drain-to-source current Ids falls from Ids2' to Ids2, which fall is not so great. As a result, the drain-to-source current Ids1 of the pixel A and the drain-to-source current Ids2 of the pixel B become substantially equal to each other. Variations in mobility μ in each pixel are thus corrected.

To summarize the above, when the pixel A and the pixel B differing in mobility μ are present, the feedback amount ΔV1 of the pixel A having the high mobility μ is larger than the feedback amount ΔV2 of the pixel B having the low mobility μ. That is, a pixel increases the feedback amount ΔV, and thus increases an amount by which the drain-to-source current Ids is reduced as the mobility μ becomes higher.

Thus, by negatively feeding back the drain-to-source current Ids of the drive transistor 22 to the side of the signal voltage Vsig of the video signal, the current values of the drain-to-source current Ids of pixels different in mobility μ are uniformized. As a result, variations in mobility μ in each pixel can be corrected.

Referring to FIGS. 9A, 9B, and 9C, description in the following will be made of relations between the signal potential (sampling potential) Vsig of the video signal and the drain-to-source current Ids of the drive transistor 22 according to whether or not the threshold value correction and the mobility correction are made in the pixel (pixel circuit) 20 shown in FIG. 2.

FIG. 9A illustrates a case where neither the threshold value correction nor the mobility correction is made. FIG. 9B illustrates a case where the mobility correction is not made and only the threshold value correction is made. FIG. 9C illustrates a case where the threshold value correction and the mobility correction are both made. As shown in FIG. 9A, when neither the threshold value correction nor the mobility correction is made, a great difference occurs in drain-tosource current Ids between the pixels A and B due to variations in threshold voltage Vth and mobility μ in the pixels A and B.

On the other hand, when only the threshold value correction is made, as shown in FIG. 9B, the threshold value correction can reduce variations in drain-to-source current Ids to some degree, but a difference in drain-to-source current Ids between the pixels A and B due to variations in mobility μ in the pixels A and B remains.

As shown in FIG. 9C, making both of the threshold value correction and the mobility correction can practically eliminate the difference in drain-to-source current Ids between the pixels A and B due to the variations in threshold voltage Vth and mobility μ in the pixels A and B. Thus, no variations in luminance of the organic EL element 21 occur at any gradation, so that a display image of excellent image quality can be obtained.

Further, the pixel 20 shown in FIG. 2 has the above-described bootstrap function in addition to the threshold value correcting function and the mobility correcting function. Thereby the following action and effect can be obtained.

Even when the I-V characteristic of the organic EL element 21 changes with the passage of time, and the source potential Vs of the drive transistor 22 changes correspondingly, the bootstrap operation of the retaining capacitance 24 holds the gate-to-source voltage Vgs of the drive transistor 22 constant, so that the current flowing through the organic EL element 21 does not change. Therefore the light emission luminance of the organic EL element 21 is also held constant. Thus, even when the I-V characteristic of the organic EL element 21 changes with the passage of time, image display without luminance degradation attendant on the secular change in the I-V characteristic of the organic EL element 21 can be achieved.

(Problem when 1H Period Becomes Shorter)

Recently, as display devices have higher definition and a larger number of pixels, the 1H period has tended to become shorter. When the 1H period becomes shorter, as described above, it is difficult to allocate a sufficient time to detect the threshold voltage Vth as the threshold value correcting period. When a sufficient time may not be secured as the threshold value correcting period, variations in the threshold voltage Vth of the drive transistor in each pixel may not be surely corrected (canceled).

[Characteristic Part of Present Embodiment]

Accordingly, instead of fixing the reference voltage Vofs written prior to the writing of the signal voltage Vsig of the video signal to the first offset voltage Vofs1 serving as a reference for the signal voltage Vsig of the video signal, the present embodiment is characterized by setting the reference voltage Vofs to a second offset voltage Vofs2 different from the first offset voltage Vofs1, specifically the second offset voltage Vofs2 higher than the first offset voltage Vofs1, and thereby initializing the gate potential Vg of the drive transistor 22 to the second offset voltage Vofs2 during initializing operation in the threshold value correction preparatory period, and changing the reference voltage Vofs from the second offset voltage Vofs2 to the first offset voltage Vofs1 before the gate-to-source voltage Vgs of the drive transistor 22 converges to the threshold voltage Vth in the threshold value correcting period.

(Horizontal Driving Circuit)

In order to realize such operation, as described above, the horizontal driving circuit 60 selects, as appropriate, one of the signal voltage Vsig of the video signal corresponding to luminance information supplied from the signal supply source (not shown), the first offset voltage Vofs, and the second offset voltage Vofs2, and then writes the voltage to the pixels 20 of the pixel array unit 30 in row units, for example, via the signal lines 33 (33-1 to 33-n).

Figure 10:
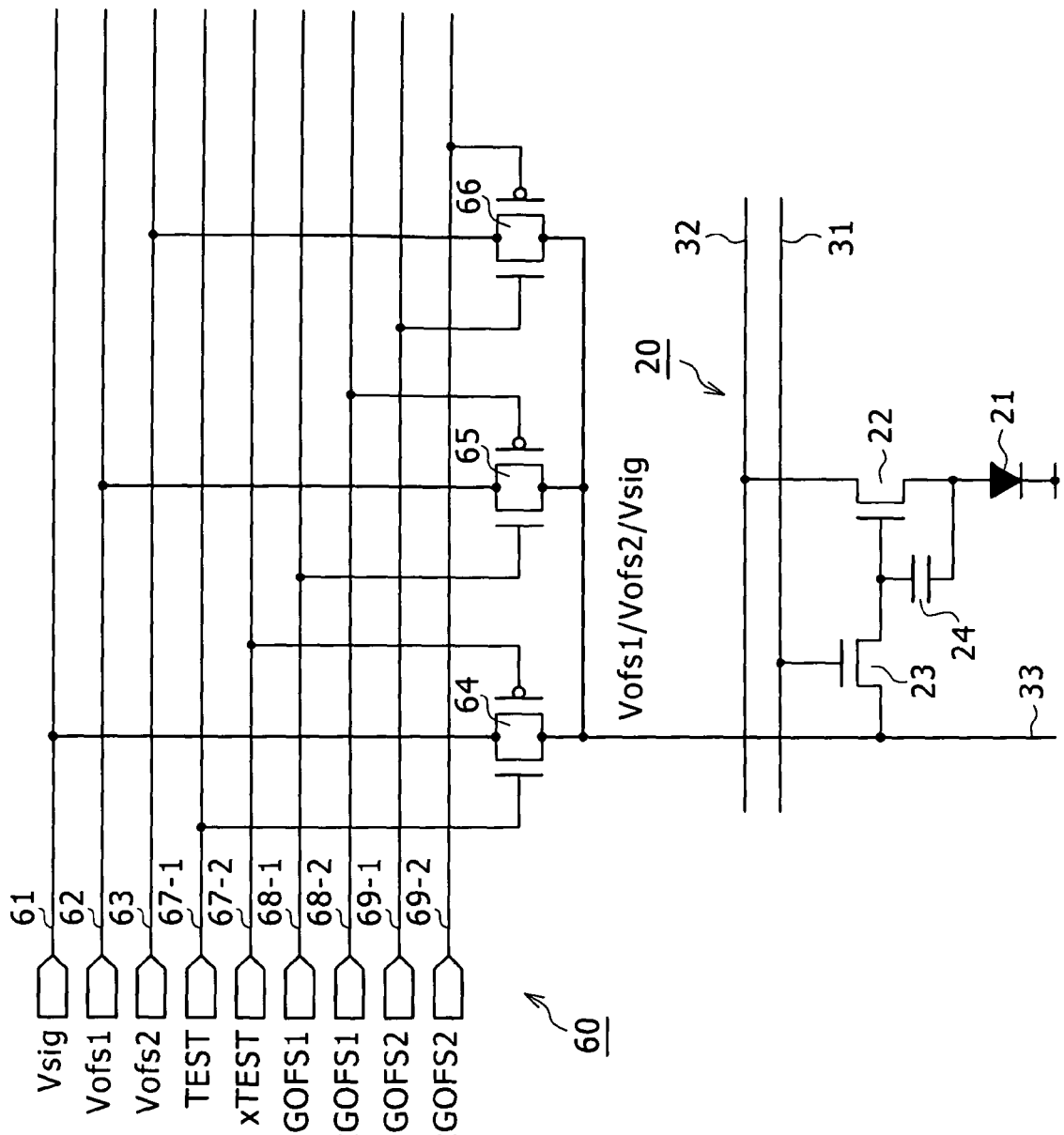
FIG. 10 is a circuit diagram showing an example of configuration of a horizontal driving circuit.

FIG. 10 is a circuit diagram showing an example of configuration of the horizontal driving circuit 60. In FIG. 10, three signal transmission lines 61, 62, and 63 are arranged on the display panel 70 along the arrangement in a horizontal direction (row direction) of the pixels 20 in the pixel array unit 30. These signal transmission lines 61, 62, and 63 are supplied with the signal voltage Vsig of the video signal, the first offset voltage Vofs, and the second offset voltage Vofs2, respectively, from the signal supply source (not shown) provided on the outside of the display panel 70.

Selecting switches 64, 65, and 66 are connected between the respective signal transmission lines 61, 62, and 63 and the signal line 33 (33-1 to 33-n) of the pixel array unit 30. The selecting switches 64, 65, and 66 are for example formed by an analog switch based on a CMOS transmission gate. The selecting switches 64, 65, and 66 select the signal voltage Vsig of the video signal, the first offset voltage Vofs, and the second offset voltage Vofs2, respectively.

The selecting switch 64 selecting the signal voltage Vsig of the video signal is subjected to on/off control by switch control signals TEST and xTEST supplied from a timing generator circuit (not shown) via control lines 67-1 and 67-2.

The selecting switch 65 selecting the first offset voltage Vofs1 is subjected to on/off control by switch control signals GOFS1 and xGOFS1 supplied from the timing generator circuit via control lines 68-1 and 68-2.

The selecting switch 66 selecting the second offset voltage Vofs2 is subjected to on/off control by switch control signals GOFS2 and xGOFS2 supplied from the timing generator circuit via control lines 69-1 and 69-2.

Figure 11:
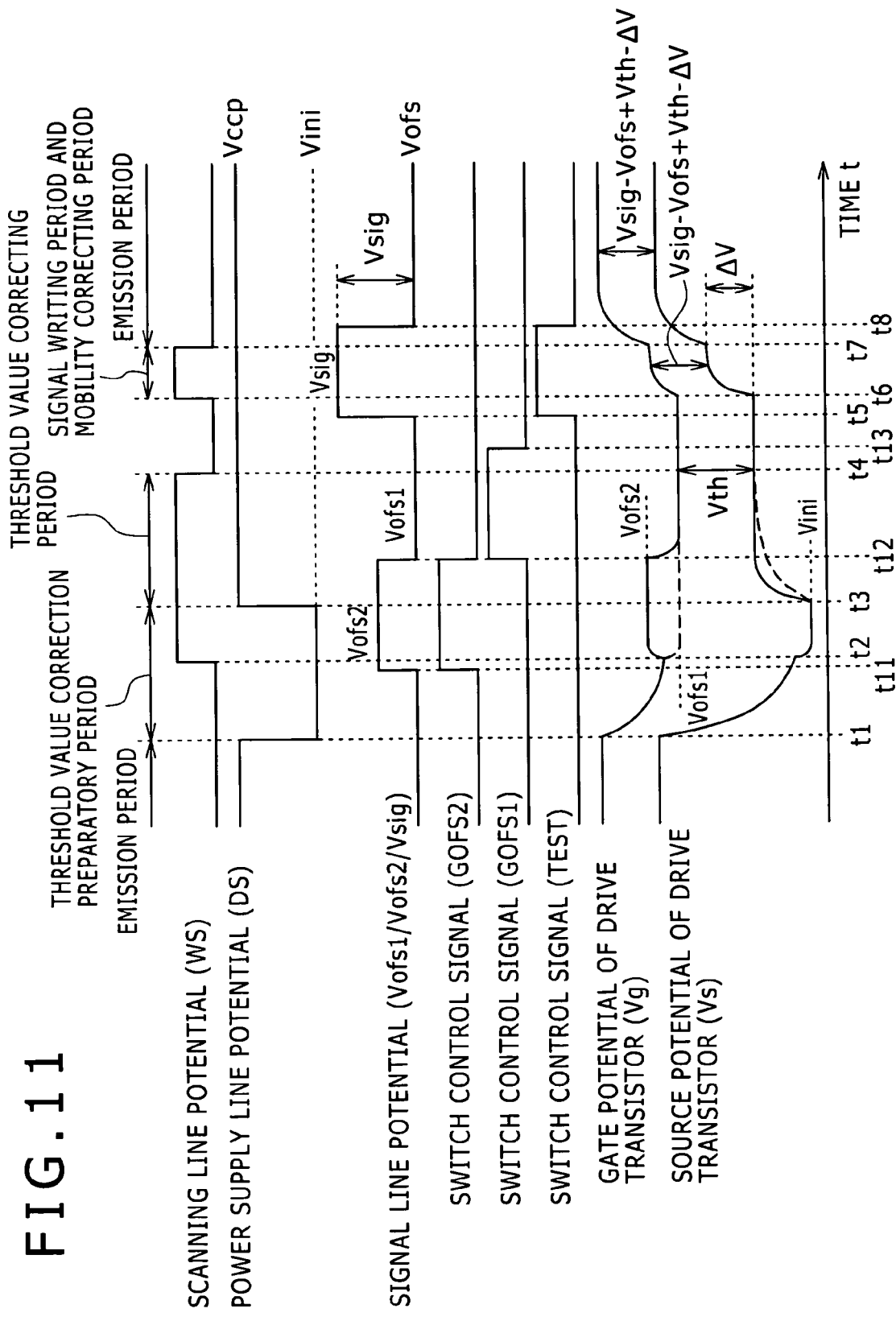
FIG. 11 is a timing waveform chart for assistance in explaining a concrete circuit operation of an organic EL display device according to an embodiment of the present invention.

FIG. 11 shows timing relation between the switch control signals TEST, GOFS1, and GOFS2 together with changes in scanning line potential (scanning signal) WS, changes in power supply line potential DS, changes in the gate potential Vg, and changes in the source potential Vs of the drive transistor 22.

The switch control signal GOFS2 in the horizontal driving circuit 60 of the above-described configuration is set in an active state (high potential) before time t2, at which the scanning line potential WS makes a transition to the high potential side and thereby the writing transistor 23 is set in a conducting state, in the threshold value correction preparatory period (t1 to t3). The second offset voltage Vofs2 is thereby supplied from the signal transmission line 63 to the signal line 33 via the selecting switch 66.

Then, at time t2, the scanning line potential WS makes a transition to the high potential side to set the writing transistor 23 in a conducting state, whereby the potential of the signal line 33, that is, the second offset voltage Vofs2 is sampled by the writing transistor 23, and then written to the inside of the pixel 20. The gate potential Vg of the drive transistor 22 is thereby initialized to the second offset voltage Vofs2 higher than the first offset voltage Vofs1 during initializing operation in the threshold value correction preparatory period.

Incidentally, as for the source potential Vs of the drive transistor 22, as described above, the power supply line potential DS changes from the high potential Vccp to the low potential Vini at time t1, so that the source potential Vs of the drive transistor 22 is in a state of being initialized to the low potential Vini.

By thus initializing the gate potential Vg of the drive transistor 22 to the second offset voltage Vofs2 higher than the first offset voltage Vofs1, the gate-to-source voltage Vgs of the drive transistor 22 becomes Vofs2−Vini. A current corresponding to the gate-to-source voltage Vgs flows through the drive transistor 22, whereby the source potential Vs rises.

At this time, the source potential Vs of the drive transistor 22 rises faster than in the case of initializing the gate potential Vg to the first offset voltage Vofs1 (represented by a dotted line in FIG. 11). Specifically, when the gate potential Vg of the drive transistor 22 is initialized to the first offset voltage Vofs1, the gate-to-source voltage Vgs becomes Vofs1−Vini, whereas when the gate potential Vg of the drive transistor 22 is initialized to the second offset voltage Vofs2, the gate-to-source voltage Vgs becomes Vofs2−Vini. In the latter case, a current larger than in the former case flows through the drive transistor 22, and thus the response speed of the rising of the source potential Vs becomes faster.

Next, at time t12 after the threshold value correcting period (t3 to t4) begins, the switch control signal GOFS2 is set in an inactive state (low potential), and the switch control signal GOFS1 is simultaneously set in an active state. Thereby, in place of the second offset voltage Vofs2, the first offset voltage Vofs1 lower than the second offset voltage Vofs2 is supplied from the signal transmission line 62 to the signal line 33 via the selecting switch 65.

At this time, the writing transistor 23 is in a conducting state, so that the first offset voltage Vofs1 supplied to the signal line 33 by the selecting switch 65 is written to the inside of the pixel 20 via the writing transistor 23. The gate potential Vg of the drive transistor 22 is thereby fixed at the first offset voltage Vofs1.

Then, with the gate potential Vg of the drive transistor 22 fixed at the first offset voltage Vofs1, the source potential Vs continues rising. Eventually, the gate-to-source voltage Vgs of the drive transistor 22 converges to the threshold voltage Vth of the drive transistor 22, and voltage corresponding to the threshold voltage Vth is retained in the retaining capacitance 24.

Operation after the threshold value correcting period is ended and the switch control signal GOFS1 is set in an inactive state at time t13 is basically the same as the above-described basic circuit operation. Incidentally, the switch control signal TEST is set in an active state at time t5, and then set in an inactive state at time t8. Thereby, during the period t5 to t8, the signal voltage Vsig of the video signal is supplied to the signal line 33 via the selecting switch 64.

(Action and Effect of Present Embodiment)

As described above, driving is performed such that the reference voltage Vofs is set to the second offset voltage Vofs2 and thereby the gate potential Vg of the drive transistor 22 is initialized to the second offset voltage Vofs2 during initializing operation during which the writing transistor 23 is in a conducting state in the threshold value correction preparatory period in which the low potential Vini is selected, and then the reference voltage Vofs is changed from the second offset voltage Vofs2 to the first offset voltage Vofs1 before the gate-to-source voltage Vgs of the drive transistor 22 converges to the threshold voltage Vth in the threshold value correcting period. Therefore, the following action and effect can be obtained.

By initializing the gate potential Vg of the drive transistor 22 to the second offset voltage Vofs2 different from the first offset voltage Vofs1 serving as a reference for the signal voltage Vsig of the video signal, specifically the second offset voltage Vofs2 higher than the first offset voltage Vofs1, the source potential Vs of the drive transistor 22 rises at a response speed faster than in the case of initializing the gate potential Vg to the first offset voltage Vofs. Therefore, a time taken for the gate-to-source voltage Vgs of the drive transistor 22 to converge to the threshold voltage Vth of the drive transistor 22 can be shortened.

In this case, the response speed when the source potential Vs of the drive transistor 22 rises is determined by the voltage value (absolute value) of the second offset voltage Vofs2. Hence, the higher the voltage value of the second offset voltage Vofs2, the faster the response speed of the rising of the source potential Vs, and thus the more the time taken for the gate-to-source voltage Vgs of the drive transistor 22 to converge to the threshold voltage Vth of the drive transistor 22 can be shortened.

Being able to shorten the time taken for the gate-to-source voltage Vgs to converge to the threshold voltage Vth means that the threshold value correcting period (t3 to t4) during which the operation of detecting the threshold voltage Vth and retaining the threshold voltage Vth in the retaining capacitance 24 is performed can be shortened. That is, the threshold voltage Vth can be detected in a shorter time than in the case of initializing the gate potential Vg of the drive transistor 22 to the first offset voltage Vofs.

By thus being able to reduce the time taken to make the threshold value correction (threshold value detection), even when the display device has a larger number of pixels as the definition of the display device becomes higher, and the 1H period is correspondingly shortened, the threshold voltage Vth of the drive transistor 22 can be surely detected within the 1H period. It is thereby possible surely to correct variations in the threshold voltage Vth of the drive transistor 22 in each pixel, and to obtain a display image of excellent image quality.

[Example of Modification]

In the foregoing embodiment, description has been made by taking as an example a case where the present invention is applied to the organic EL display device 10 that has the pixel 20 of the 2Tr/1C pixel configuration including the drive transistor 22 for driving the organic EL element 21, the writing transistor 23 for writing the signal voltage Vsig of the video signal, and the retaining capacitance 24 for retaining the signal voltage Vsig of the video signal which voltage is written by the writing transistor 23, which display device changes the power supply line potential DS supplied to the drain electrode of the drive transistor 22 between the high potential Vccp and the low potential Vini, and which display device selectively writes the reference voltage Vofs from the signal line 33. However, the present invention is not limited to this example of application.

Specifically, the present invention is similarly applicable to organic EL display devices of pixel configurations further including a switching transistor that is set in a conducting state as appropriate prior to the current driving of the organic EL element 21 to thereby perform operation for initializing the gate potential Vg and the source potential Vs of the drive transistor 22 to the reference voltage Vofs and the low potential Vini, thereafter detecting the threshold voltage Vth of the drive transistor 22, and retaining the detected threshold voltage Vth in the retaining capacitance 24.

In addition, in the foregoing embodiment, description has been made by taking as an example a case where the present invention is applied to an organic EL display device that uses the organic EL element as an electrooptic element of the pixel circuit 20. However, the present invention is not limited to this example of application. The present invention is applicable to display devices in general using a current-driven type electrooptic element (light emitting element) changing in light emission luminance according to the value of current flowing through the device.

[Examples of Application]

The display device according to the above-described embodiment of the present invention is for example applicable to display devices of various electronic devices shown in FIGS. 12 to 16G, for example electronic devices in all fields that display a video signal input thereto or a video signal generated therein as an image or video, such for example as digital cameras, notebook personal computers, portable terminal devices such as portable telephones and the like, and video cameras.

By thus using the display device according to the foregoing embodiment of the present invention as display devices of electronic devices in all fields, as is clear from the description of the foregoing embodiment, the display device according to the foregoing embodiment of the present invention offers an advantage of being able to make excellent image display in the various electronic devices because the display device according to the foregoing embodiment of the present invention can surely correct variations in the threshold voltage Vth of the drive transistor in each pixel.

Incidentally, the display device according to the foregoing embodiment of the present invention includes a display device in the form of a sealed module. For example, a display module formed by attaching a counter part such as a transparent glass or the like to the pixel array unit 30 corresponds to a display device in the form of a sealed module. This transparent counter part may be provided with a color filter, a protective film or the like, and a light shielding film as described above. Incidentally, the display module may be provided with a circuit part for externally inputting or outputting a signal and the like to the pixel array unit, an FPC (Flexible Printed Circuit), or the like.

Concrete examples of electronic devices to which the present embodiment is applied will be described in the following.

Figure 12:
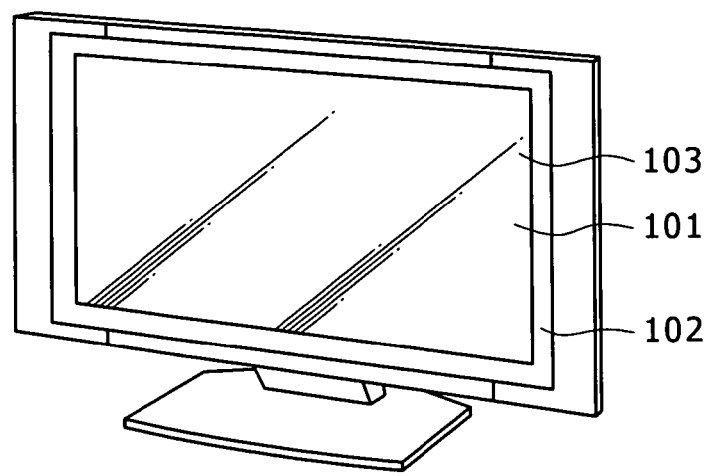
FIG. 12 is a perspective view of an external appearance of a television set to which the present embodiment is applied.

FIG. 12 is a perspective view of an external appearance of a television set to which the present embodiment is applied. The television set according to the present example of application includes a video display screen part 101 composed of a front panel 102, a filter glass 103 and the like, and is fabricated using the display device according to the foregoing embodiment of the present invention as the video display screen part 101.

Figure 13A:
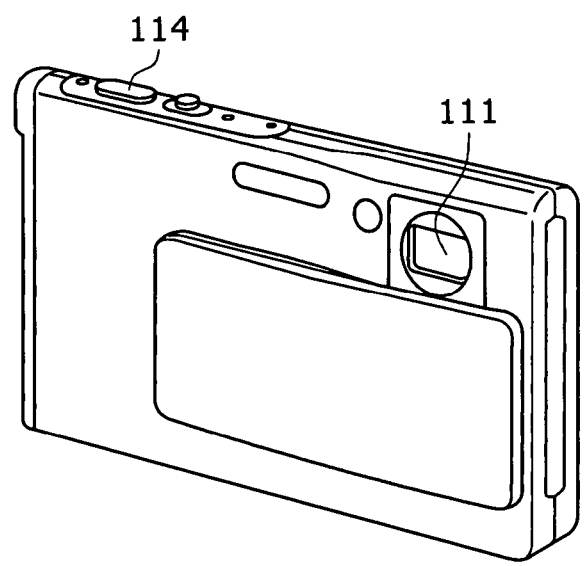
FIGS. 13A and 13B are perspective views of an external appearance of a digital camera to which the present embodiment is applied, FIG. 13A being a perspective view of the digital camera as viewed from a front side, and FIG. 13B being a perspective view of the digital camera as viewed from a back side.
Figure 13B:
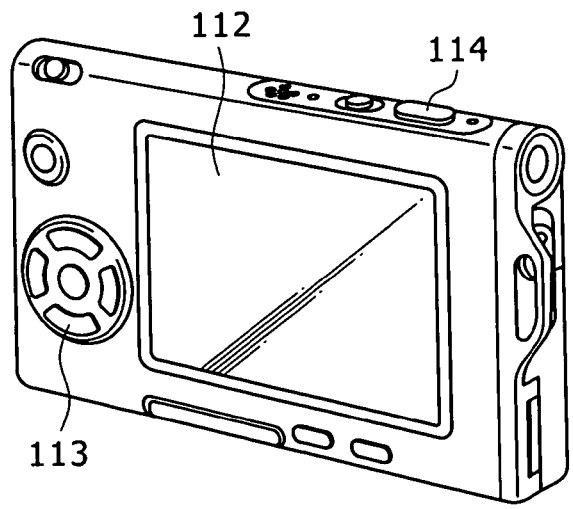

FIGS. 13A and 13B are perspective views of an external appearance of a digital camera to which the present embodiment is applied. FIG. 13A is a perspective view of the digital camera as viewed from a front side, and FIG. 13B is a perspective view of the digital camera as viewed from a back side. The digital camera according to the present example of application includes a light emitting part 111 for flashlight, a display part 112, a menu switch 113, a shutter button 114, and the like. The digital camera is fabricated using the display device according to the foregoing embodiment of the present invention as the display part 112.

Figure 14:
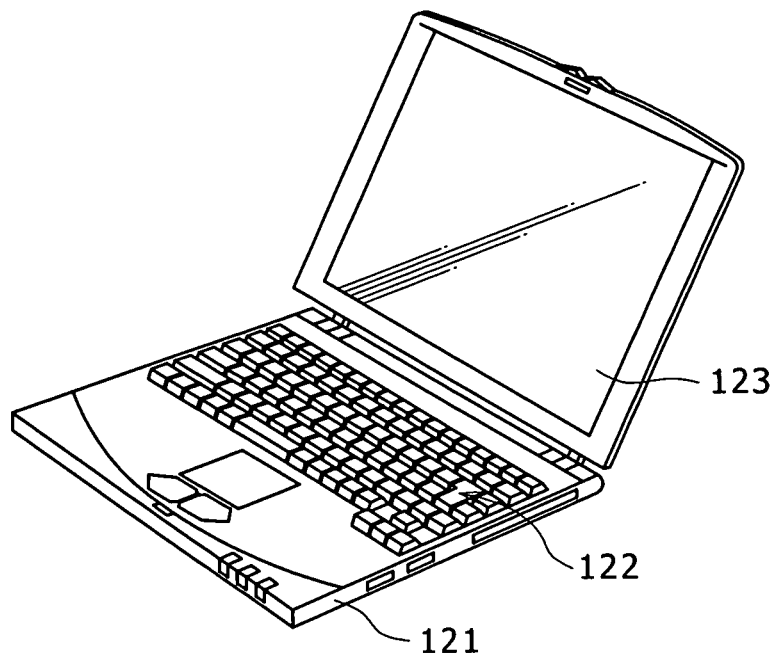
FIG. 14 is a perspective view of an external appearance of a notebook personal computer to which the present embodiment is applied.

FIG. 14 is a perspective view of an external appearance of a notebook personal computer to which the present embodiment is applied. The notebook personal computer according to the present example of application includes a keyboard 122 operated to input characters and the like, a display part 123 for displaying an image, and the like in a main unit 121. The notebook personal computer is fabricated using the display device according to the foregoing embodiment of the present invention as the display part 123.

Figure 15:
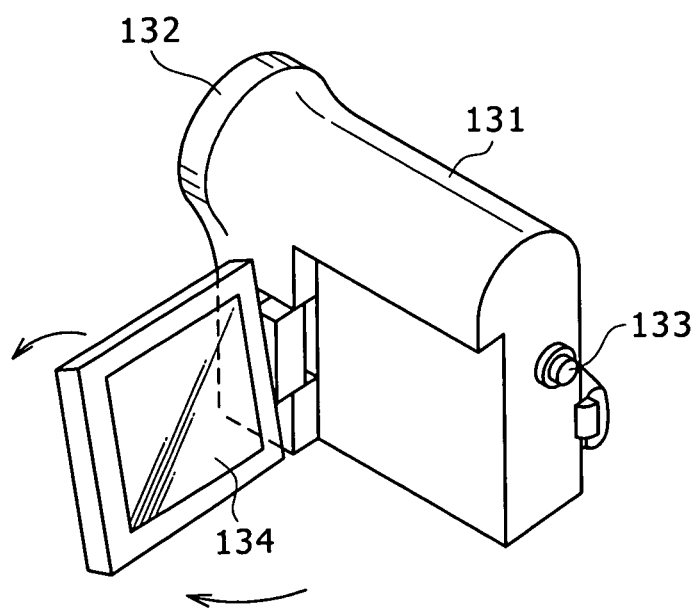
FIG. 15 is a perspective view of an external appearance of a video camera to which the present embodiment is applied.

FIG. 15 is a perspective view of an external appearance of a video camera to which the present embodiment is applied. The video camera according to the present example of application includes a main unit 131, a lens 132 for taking a subject in a side surface facing frontward, a start/stop switch 133 at a time of picture taking, a display part 134, and the like. The video camera is fabricated using the display device according to the foregoing embodiment of the present invention as the display part 134.

FIGS. 16A, 16B, 16C, 16D, 16E, 16F, and 16G are diagrams showing an external appearance of a portable terminal device, for example a portable telephone to which the present embodiment is applied. FIG. 16A is a front view of the portable telephone in an opened state, FIG. 16B is a side view of the portable telephone in the opened state, FIG. 16C is a front view of the portable telephone in a closed state, FIG. 16D is a left side view, FIG. 16E is a right side view, FIG. 16F is a top view, and FIG. 16G is a bottom view. The portable telephone according to the present example of application includes an upper side casing 141, a lower side casing 142, a coupling part (a hinge part in this case) 143, a display 144, a sub-display 145, a picture light 146, a camera 147, and the like. The portable telephone is fabricated using the display device according to the foregoing embodiment of the present invention as the display 144 and the sub-display 145.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a pixel array unit formed by arranging pixels in a form of a matrix, said pixels including an electrooptic element, a writing transistor which writes a video signal, a retaining capacitance which retains said video signal written by said writing transistor, and a drive transistor which drives said electrooptic element on a basis of said video signal retained in said retaining capacitance;
a first scanning circuit configured to selectively supply a first potential and a second potential lower than said first potential to a power supply line that is disposed in each pixel row of said pixel array unit, said power supply line supplying current through said drive transistor to said electrooptic element;
a second scanning circuit configured to set said writing transistor in a conducting state or a non-conducting state while selecting the pixels of said pixel array unit in row units by driving said writing transistor in each pixel row of said pixel array unit, wherein said writing transistor is switched from said non-conducting state to said conducting state at a first timing occurring when said second potential is being supplied to said power supply line, and
a selecting circuit configured to selectively supply (1) said video signal, (2) a first offset voltage serving as a reference for said video signal and being different from said video signal, and (3) a second offset voltage different from said first offset voltage and different from said video signal to a signal line disposed in each column of said pixel array unit, and configured to:
supply said second offset voltage to the signal line at least during a second timing occurring after the first timing and when said writing transistor is in said conducting state while said second potential is supplied to said power supply line, wherein the second potential changes to said first potential in said power supply line at a third timing occurring after the second timing;
supply said first offset voltage to the signal line in place of said second offset voltage after the third timing and before a fourth timing, wherein said writing transistor is switched from said conducting state to said non-conducting state at the fourth timing, and
supply said video signal to the signal line in place of said first offset voltage after said fourth timing.

2. The display device according to claim 1,
wherein an operation of making a gate-to-source voltage of said drive transistor converge to a threshold voltage of said drive transistor and retaining said threshold voltage in said retaining capacitance is performed in a period from the third timing to the fourth timing.

3. An electronic device having the display device of claim 1.

4. The electronic device according to claim 3,
wherein an operation of making a gate-to-source voltage of said drive transistor converge to a threshold voltage of said drive transistor and retaining said threshold voltage in said retaining capacitance is performed in a period from the third timing to the fourth timing.

5. A display device comprising:
a pixel array unit formed by arranging pixels in a form of a matrix, said pixels including an electrooptic element, a writing transistor which writes a video signal, a retaining capacitance which retains said video signal written by said writing transistor, and a drive transistor which drives said electrooptic element on a basis of said video signal retained in said retaining capacitance;
a first scanning circuit configured to selectively supply a first potential and a second potential lower than said first potential to a power supply line that is disposed in each pixel row of said pixel array unit, said power supply line supplying current through said drive transistor to said electrooptic element;
a second scanning circuit configured to set said writing transistor in a conducting state in a period in which said second potential is supplied to said power supply line, and setting said writing transistor in a non-conducting state after a change from said second potential to said first potential in said power supply line, while selecting the pixels of said pixel array unit in row units by driving said writing transistor in each pixel row of said pixel array unit; and
a selecting circuit configured to selectively supply said video signal, a first offset voltage serving as a reference for said video signal, and a second offset voltage different from said first offset voltage to a signal line disposed in each column of said pixel array unit, and configured to select said second offset voltage at least when said writing transistor is in the conducting state in the period in which said second potential is supplied to said power supply line, and configured to select said first offset voltage in place of said second offset voltage after the change from said second potential to said first potential in said power supply line and before said writing transistor is set in the non-conducting state,
wherein an operation of making a gate-to-source voltage of said drive transistor converge to a threshold voltage of said drive transistor and retaining said threshold voltage in said retaining capacitance is performed in a period from timing of the change from said second potential to said first potential in said power supply line to timing of transition of said writing transistor to the non-conducting state, and
wherein said selecting circuit selects said first offset voltage in place of said second offset voltage, said second offset voltage being greater than said first offset voltage, before the gate-to-source voltage of said drive transistor converges to the threshold voltage of said drive transistor.

6. A driving method of a display device, said display device including
a pixel array unit formed by arranging pixels in a form of a matrix, said pixels including an electrooptic element, a writing transistor which writes a video signal, a retaining capacitance which retains said video signal written by said writing transistor, and a drive transistor which drives said electrooptic element on a basis of said video signal retained in said retaining capacitance,
a first scanning circuit configured to selectively supply a first potential and a second potential lower than said first potential to a power supply line that is disposed in each pixel row of said pixel array unit, said power supply line supplying current through said drive transistor to said electrooptic element,
a second scanning circuit configured to selectively supply the pixels of said pixel array unit in row units by driving said writing transistor in each pixel row of said pixel array unit, and
a selecting circuit configured to selectively supply (1) said video signal, (2) a first offset voltage serving as a reference for said video signal and being different from said video signal, and (3) a second offset voltage different from said first offset voltage and different from said video signal to a signal line disposed in each column of said pixel array unit,
said driving method comprising:
selecting said second offset voltage at a first timing occurring when said second potential is being supplied to said power supply line;
switching said writing transistor from a non-conducting state to a conducting state at a second timing occurring while said second potential is being supplied to said power supply line;
changing from said second potential to said first potential in said power supply line at a third timing occurring after the first and second timings;
selecting said first offset voltage in place of said second offset voltage at a fourth timing occurring after the third timing;
switching said writing transistor from said conducting state to said non-conducting state at a fifth timing occurring after the fourth timing; and
selecting said video signal in place of said first offset voltage at a sixth timing occurring after the fifth timing.

7. The method of driving a display device according to claim 6,
wherein a gate-to-source voltage of said drive transistor is made to converge to a threshold voltage of said drive transistor and said threshold voltage is retained in said retaining capacitance after the third timing and before the fourth timing.

8. A driving method of a display device, said display device including
a pixel array unit formed by arranging pixels in a form of a matrix, said pixels including an electrooptic element, a writing transistor which writes a video signal, a retaining capacitance which retains said video signal written by said writing transistor, and a drive transistor which drives said electrooptic element on a basis of said video signal retained in said retaining capacitance,
a first scanning circuit configured to selectively supply a first potential and a second potential lower than said first potential to a power supply line that is disposed in each pixel row of said pixel array unit, said power supply line supplying current through said drive transistor to said electrooptic element,
a second scanning circuit configured to selectively supply the pixels of said pixel array unit in row units by driving said writing transistor in each pixel row of said pixel array unit, and
a selecting circuit configured to selectively supply said video signal, a first offset voltage serving as a reference for said video signal, and a second offset voltage different from said first offset voltage to a signal line disposed in each column of said pixel array unit,
said driving method comprising:
selecting said second offset voltage and setting said writing transistor in a conducting state in a period in which said second potential is supplied to said power supply line;
next changing from said second potential to said first potential in said power supply line;
next selecting said first offset voltage in place of said second offset voltage; and
then setting said writing transistor in a non-conducting state
wherein a gate-to-source voltage of said drive transistor is made to converge to a threshold voltage of said drive transistor and said threshold voltage is retained in said retaining capacitance after the change from said second potential to said first potential in said power supply line and before the transition of said writing transistor to the non-conducting state, and
wherein said first offset voltage is selected in place of said second offset voltage before the gate-to-source voltage of said drive transistor converges to the threshold voltage of said drive transistor and said second offset voltage is greater than said first offset voltage.

9. An electronic device having a display device,
wherein said display device includes
a pixel array unit formed by arranging pixels in a form of a matrix, said pixels including an electrooptic element, a writing transistor which writes a video signal, a retaining capacitance which retains said video signal written by said writing transistor, and a drive transistor which drives said electrooptic element on a basis of said video signal retained in said retaining capacitance,
a first scanning circuit configured to selectively supply a first potential and a second potential lower than said first potential to a power supply line that is disposed in each pixel row of said pixel array unit, said power supply line supplying current through said drive transistor to said electrooptic element,
a second scanning circuit configured to set said writing transistor in a conducting state in a period in which said second potential is supplied to said power supply line, and making said writing transistor make a transition to a non-conducting state after a change from said second potential to said first potential in said power supply line, while selecting the pixels of said pixel array unit in row units by driving said writing transistor in each pixel row of said pixel array unit, and
a selecting circuit configured to selectively supply said video signal, a first offset voltage serving as a reference for said video signal, and a second offset voltage different from said first offset voltage to a signal line disposed in each column of said pixel array unit, and configured to select said second offset voltage at least when said writing transistor is in the conducting state in the period in which said second potential is supplied to said power supply line, and configured to select said first offset voltage in place of said second offset voltage after the change from said second potential to said first potential in said power supply line and before said writing transistor makes the transition to the non-conducting state,
wherein an operation of making a gate-to-source voltage of said drive transistor converge to a threshold voltage of said drive transistor and retaining said threshold voltage in said retaining capacitance is performed in a period from timing of the change from said second potential to said first potential in said power supply line to timing of transition of said writing transistor to the non-conducting state, and
wherein said selecting circuit selects said first offset voltage in place of said second offset voltage, said second offset voltage being greater than said first offset voltage, before the gate-to-source voltage of said drive transistor converges to the threshold voltage of said drive transistor.

10. A display device comprising:
a pixel array unit including pixels arranged in a matrix from, each including an electrooptic element, a writing transistor which writes a video signal, a retaining capacitance which retains the video signal written by the writing transistor, and a drive transistor which drives the electrooptic element on a basis of the video signal retained in the retaining capacitance; and
a control unit configured to:
selectively supply a first potential and a second potential lower than the first potential to power supply lines that supply drive currents to the pixels,
selectively supply control signals to scanning lines, the control signals controlling conductivity of the respective writing transistors of the pixels, and
selectively supply to signal lines (1) the video signal, (2) a first offset voltage serving as a reference for the video signal and being different from the video signal, and (3) a second offset voltage different from the first offset voltage and different from the video signal,
wherein the control unit is configured to drive the pixels by:
supplying the second offset voltage to the signal line at a first timing,
switching the writing transistor from a non-conducting state to a conducting state at a second timing occurring when the second potential is being supplied to the power supply line;
changing, at a third timing, from supplying the second potential to the power supply lines to supplying the first potential to the power supply lines, the third timing occurring after the second timing;
supplying the first offset voltage to the signal line in place of the second offset voltage at a fourth timing occurring after the first and third timings;
switching the writing transistor from the conducting state to the non-conducting state at a fifth timing occurring after the fourth timing; and
supplying the video signal to the signal line in place of the first offset voltage at a sixth timing occurring after the fourth timing.

11. The display device of claim 10,
wherein the first timing occurs before the third timing and the sixth timing occurs after the fifth timing.

12. The display device of claim 11,
wherein the first timing occurs before the second timing.

13. An electronic apparatus, comprising a display device according to claim 12.

14. The display device of claim 11,
wherein the control unit is configured to cause a threshold correction operation to be performed beginning at the third timing, the threshold correction operation causing a gate-to-source voltage of the drive transistor to converge to a threshold voltage of the drive transistor and the threshold voltage to be retained in the retaining capacitance.

15. The display device of claim 14,
wherein the fourth timing occurs before the gate-source voltage of the drive transistor has converged to the threshold voltage.

16. An electronic apparatus, comprising a display device according to claim 15.

17. An electronic apparatus, comprising a display device according to claim 14.

18. An electronic apparatus, comprising a display device according to claim 11.

19. An electronic apparatus, comprising a display device according to claim 10.

* * * * *